(12) United States Patent
Deng et al.

(10) Patent No.: US 8,228,749 B2
(45) Date of Patent: Jul. 24, 2012

(54) MARGIN TESTING OF STATIC RANDOM ACCESS MEMORY CELLS

(75) Inventors: Xiaowei Deng, Plano, TX (US); Wah Kit Loh, Richardson, TX (US); Lakshmikantha V. Holla, Bangalore (IN); Parvinder Kumar Rana, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 319 days.

(21) Appl. No.: 12/794,139

(22) Filed: Jun. 4, 2010

(65) Prior Publication Data

US 2011/0299349 A1     Dec. 8, 2011

(51) Int. Cl.
*G11C 29/50* (2006.01)
*G11C 11/40* (2006.01)
*G11C 7/12* (2006.01)

(52) U.S. Cl. ......... 365/201; 365/154; 365/190; 365/203
(58) Field of Classification Search .................. None
See application file for complete search history.

(56) References Cited

U.S. PATENT DOCUMENTS 5,034,923 A * 7/1991 Kuo et al. ................ 365/189.16
7,304,895 B2 * 12/2007 Joshi et al. ............. 365/189.011
7,502,275 B2 * 3/2009 Nii et al. ..................... 365/226

OTHER PUBLICATIONS

Meixner et al., "Weak Write Test Mode: An SRAM Cell Stability Design for Test Technique", Proc. IEEE Int. Test Conf. (Nov. 1997), pp. 1043-1052.

Pavlov et al., "Weak Cell Detection in Deep-Submicron SRAMs: A Programmable Detection Technique", J. Solid State Circ., vol. 41, No. 10 (IEEE, Oct. 2006), pp. 2334-2343.
Pavlov et al., "An SRAM Weak Cell Fault Model and a DFT Technique with a Programmable Detection Threshold", Paper 35.3, ITC International Test Conference (IEEE, 2004), pp. 1006-1015.
Liu et al., "High Read Stability and Low Leakage Cache Memory Cell", Proceedings of the IEEE International Symposium on Circuits and Systems (IEEE, 2007), pp. 2774-2777.
Lohstroh et al., "Worst-Case Static Noise Margin Criteria for Logic Circuits and Their Mathematical Equivalence", J. Solid-State Circuits, vol. SC-18, No. 6 (IEEE, 1983), pp. 803-807.
Seevinck et al., "Static-Noise Margin Analysis of MOS SRAM Cells", J. Solid-State Circuits, vol. SC-22, No. 5 (IEEE, 1987), pp. 748-754.

* cited by examiner

*Primary Examiner* — Tan T. Nguyen
(74) *Attorney, Agent, or Firm* — Rose Alyssa Keagy; Wade J. Brady, III; Frederick J. Telecky, Jr.

(57) ABSTRACT

A static random access memory (SRAM) and method of evaluating the same for cell stability, write margin, and read current margin. The memory is constructed so that bit line precharge can be disabled, and so that complementary bit lines for each column of cells can float during memory operations. The various tests are performed by precharging the bit lines for a column, then floating the bit lines, and while the bit lines are floating, pulsing the word lines of one or more selected cells to cause the voltage on one of the bit lines to discharge. The discharged bit line voltage is then applied to another cell, which is then read in a normal read operation to determine whether its state changed due to the discharged bit line voltage. The memory can be characterized for cell stability, write margin, and read current margin in this manner; the method can also be adapted into a manufacturing margin screen, or used in failure analysis.

22 Claims, 18 Drawing Sheets

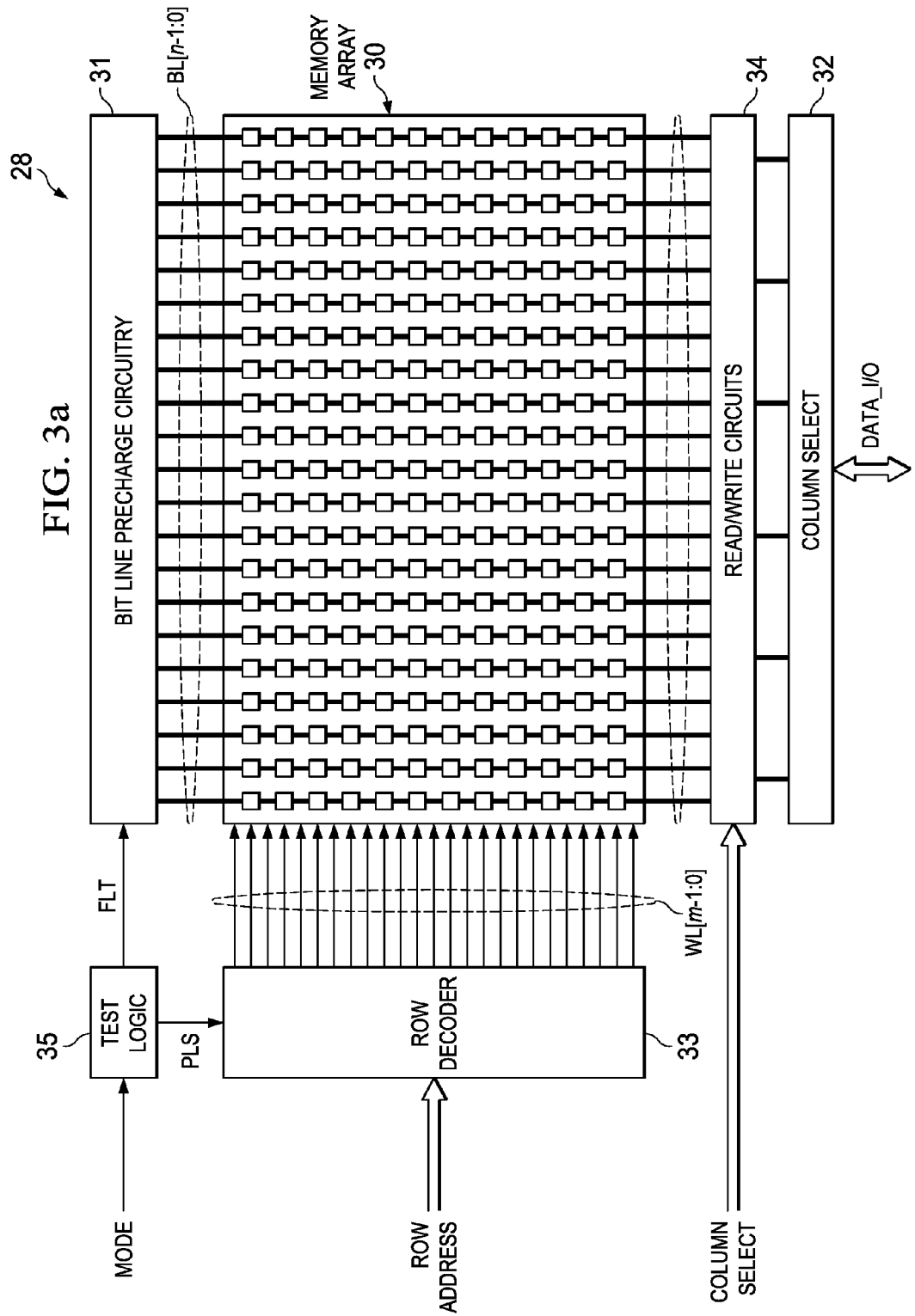

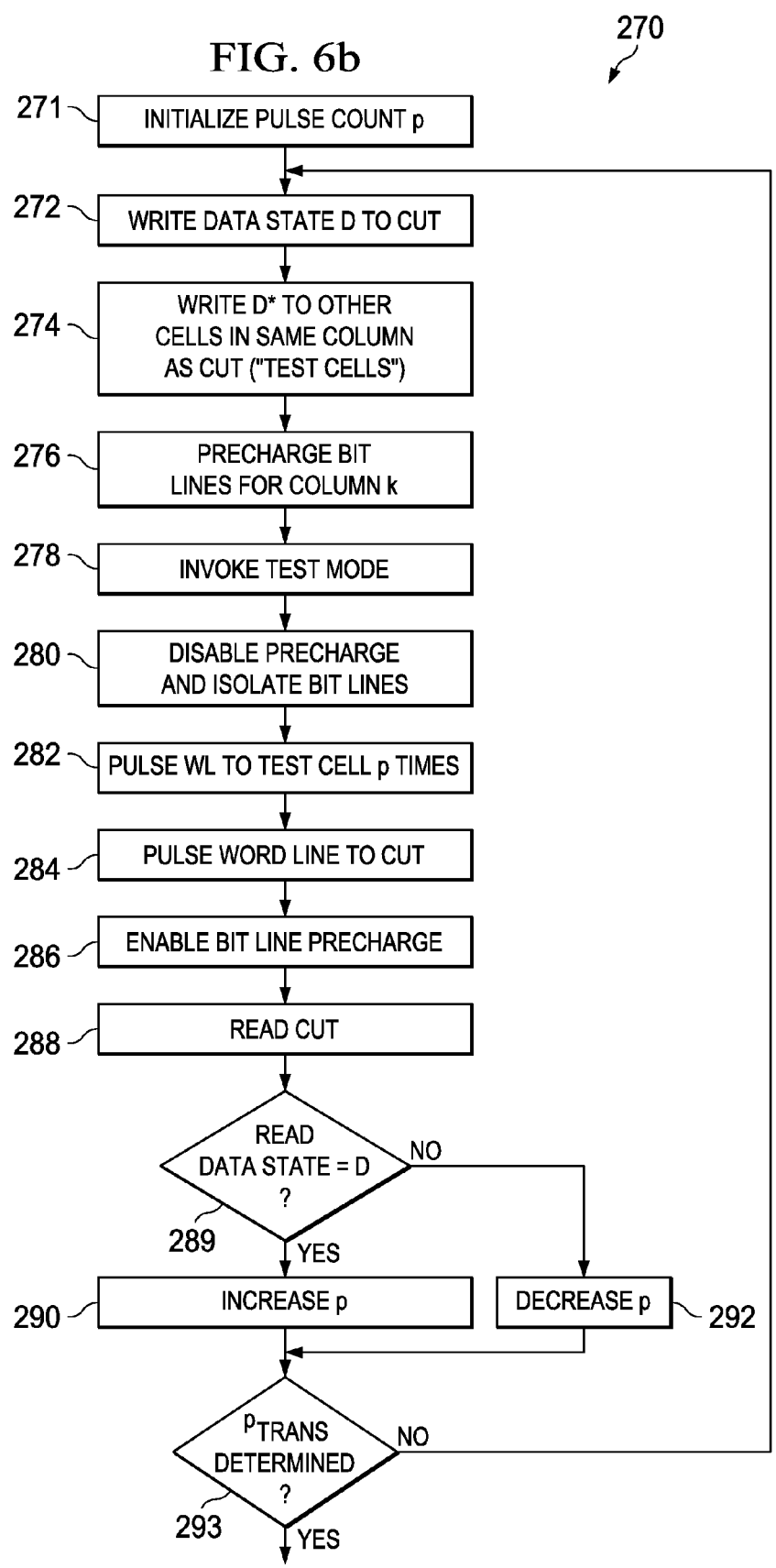

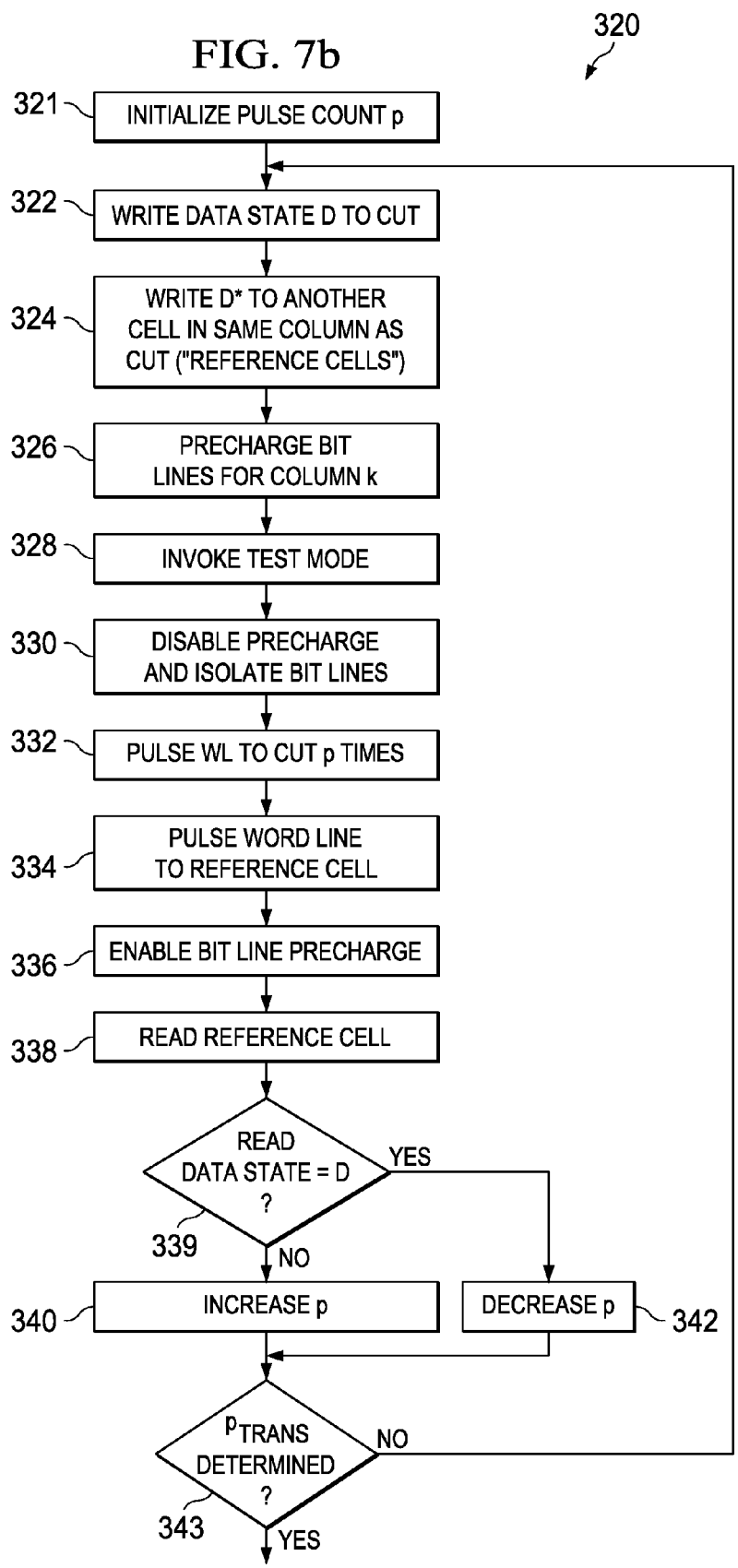

MARGIN TESTING OF STATIC RANDOM ACCESS MEMORY CELLS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit test and evaluation, and is more specifically directed to test and analysis of operating margins in solid-state memories.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM memory cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM memory but also in SRAM memory realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

These failure mechanisms include, among others, cell stability failures, write failures, and read failures. In a general sense, a cell stability failure occurs when an unaddressed SRAM cell changes state, for example as a result of an access to a neighboring cell that disturbs the unaddressed cell sufficiently to cause its stored data state to "flip". A write failure occurs when an addressed SRAM cell does not change its stored state when written with the opposite data state, and a read failure occurs when an addressed cell fails to communicate a sufficiently strong signal indicative of its stored state.

These various failure mechanisms will now be described in further detail in connection with an example of a conventional SRAM cell, referring to FIG. 1a. In this example, SRAM cell 12 of FIG. 1a is a conventional six-transistor (6-T) static memory cell 12, which in this case is in the $j^{th}$ row and $k^{th}$ column of a memory array. SRAM memory cell 12 is biased between the voltage on power supply line $V_{dda}$ and a ground reference voltage $V_{ssa}$. SRAM memory cell 12 is constructed in the conventional manner as a pair of cross-coupled CMOS inverters, one inverter of series-connected p-channel transistor 13p and n-channel transistor 13n, and the other inverter of series-connected p-channel transistor 14p and n-channel transistor 14n; the gates of the transistors in each inverter are connected together and to the common drain node of the transistors in the other inverter, in the usual manner. The common drain node of transistors 13p, 13n constitutes storage node SNT, and the common drain node of transistors 14p, 14n constitutes storage node SNB, in this example. N-channel pass transistor 15a has its source/drain path connected between storage node SNT and bit line $BLT_k$ for the $k^{th}$ column, and n-channel pass transistor 15b has its source/drain path connected between storage node SNB and bit line $BLB_k$. The gates of pass transistors 15a, 15b are driven by word line $WL_j$ for this $j^{th}$ row in which cell 12 resides.

In operation, bit lines $BLT_k$, $BLB_k$ are typically precharged to a high voltage (at or near power supply voltage $V_{dda}$), and are equalized to the same voltage. To access cell 12 for a read operation, word line $WL_j$ is then energized, turning on pass transistors 15a, 15b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 12 to latch in the desired state.

Cell stability refers to the ability of SRAM cell 12 to withstand static noise without changing states. A quantitative measure of cell stability is referred to in the art as static noise margin, which corresponds to the noise at a storage node that the cell can tolerate without changing its logic state. FIG. 1b graphically illustrates the concept of static noise margin for cell 12 of FIG. 1a. In FIG. 1b, the storage node voltages $V_{SNT}$, $V_{SNB}$ are plotted against one another. Curve $TF_{1-0}$ represents the transfer function of the storage node voltages $V_{SNT}$, $V_{SNB}$ for a transition of cell 12 from a "1" data state to a "0" data state (i.e., storage node SNT changing state from high to low). Conversely, curve $TF_{0-1}$ represents the transfer function for the opposite data transition. The two stable points STR1, STR0 represent the operating points at which a relatively stable cell 12 resides in the "1" and "0" data states, respectively; these points STR1, STR0 are stable in the sense that the storage node voltages $V_{SNT}$, $V_{SNB}$ will return to these points after small voltage variations. Metastable operating point VX$_{STR}$ is at the crossing point of the two transfer function curves TF$_{0-1}$, TF$_{1-0}$, with a storage node SNT voltage VM$_{STR}$; this operating point VX$_{STR}$ can serve as a balanced indeterminate logic state, but is metastable in the sense that a small variation in voltage at either storage node would cause cell 12 to flip to one of the stable logic states. For this stable cell 12, with operating points STR1, STR0, the static noise margin for the "1" state is represented by the size of square SNM$_{STR}$; a similar square is defined for the "0" state, as shown in FIG. 1b.

The transfer functions of a weak cell are also shown in FIG. 1b. For the sake of clarity of this description, this weak, or unstable, cell 12 has a "1" state operating point WK1 (its "0" state operating point STR0 is the same as described above, in this example). This operating point WK1 indicates that storage node SNB is not strongly pulled toward ground V$_{ssa}$ by transistor 14n. As known in the art, this condition is due to such physical causes as transistor drive mismatch within cell 12, for example resulting in transistor 14p (operating in its saturated regime due to the high level at its gate voltage) pulling storage node SNB toward power supply voltage V$_{dda}$. This shifts the transfer function for this weak cell 12, as shown by curve TF*$_{1-0}$ in FIG. 1b. The static noise margin for this weak "1" cell is smaller than that for the strong cell, as evident by smaller square SNM$_{WK}$ shown in FIG. 1b. As a result, metastable operating point VX$_{WK}$ at the crossing point of the transfer function curves TF*$_{1-0}$, TF$_{0-1}$ is at a higher storage node SNT voltage VM$_{WK}$ than voltage VM$_{STR}$ of metastable operating point VX$_{STR}$, reflecting that the cell will change state from "1" to "0" at a higher bit line voltage than will a strong cell.

A conventional cell stability test is performed by setting cell 12 to a known state, then applying a disturb voltage to one of its storage nodes, and then determining whether a change of stored state resulted. For example, referring to FIG. 1b, cell 12 is first set into a "1" state (storage node SNT at a "1" level), following which a disturb voltage is applied to storage node SNT, pulling that node voltage down to voltage VTEST. If cell 12 is a stable cell, for example with static noise margin SNM$_{STR}$ as shown in FIG. 1b, a storage node voltage V$_{SNT}$=VTEST is above metastable voltage VM$_{STR}$ of operating point VX$_{STR}$. Cell 12 would return to operating point STR1 in this event, despite the disturb voltage. Conversely, if cell 12 is relatively unstable, for example with static noise margin SNM$_{WK}$ as shown in FIG. 1b, a storage node voltage V$_{SNT}$=VTEST is below metastable voltage VM$_{WK}$. In this case, cell 12 would "flip" logic states, settling to operating point STR0 as a result. In this case, the disturb voltage at storage node SNT causes cell 12 to lose its data state.

Of course, it is difficult to apply such a disturb voltage directly to storage nodes of SRAM cells in actual SRAM memories, and cumbersome to provide the necessary internal conductors within the memory to do so. One conventional approach to performing such a cell stability test implements a "weak write" special test mode in the memory. This approach is described in Meixner et al., "Weak Write Test Mode: An SRAM Cell Stability Design for Test Technique", *Proc. IEEE Int. Test Conf.* (November 1997), pp. 1043-52. However, as described in this paper, this test method requires implementation of special "weak" write circuits in the memory itself, which will of course be redundant with the normal memory write circuits and thus require additional chip area for the circuits and associated control and data conductors.

Another cell stability test is described in Pavlov et al., "Weak Cell Detection in Deep-Submicron SRAMs: A Programmable Detection Technique", *J. Solid State Circ.*, Vol. 41, No. 10 (IEEE, October 2006), pp. 2334-43. In this approach a cell under test is written to a known data state. Other cells in its same column (i.e., that share the same bit line pairs) are written, with the ratio n of their data states corresponding to the ratio of these same-column cells that receive an opposite data state from that of the cell under test, to those that receive the same data state. Bit line precharge is then disabled, and the word lines of the written disturb cells are simultaneously energized, discharging the bit line according to the data ratio n. The word line of the cell under test is then pulsed, to transfer the "disturb" voltage now present on the bit lines to the storage nodes of the cell under test. A read of the cell under test determines whether the disturb voltage upset the previously stored data state. However, it is believed that the simultaneous energizing of multiple word lines in a memory array requires a large amount of switching power to be provided to, and by, row decoders and word line drive circuits. While this power consumption would be required only in device test, the conductors and drive circuits involved in driving multiple word lines must be designed and constructed accordingly, involving additional chip area.

Other conventional tests for cell stability include reducing the power supply voltage (i.e., power supply voltage V$_{dda}$ in FIG. 1a) while maintaining normal peripheral circuit bias, and then operating the memory. Another stability test involves performing "long" writes to some cells in the array, to determine whether other cells were disturbed.

Write failures in SRAM memories occur when the SRAM cell does not properly switch its stored state in a write operation. Typically, this failure has been observed to be due to the inability of write circuitry to pull down the storage node currently latched to a high voltage. For example, referring to FIG. 1a, beginning from a state in which storage node SNT is at a "1" and storage node SNB is at a "0", the writing of a "0" state will be performed by bit line BLT$_k$ being pulled low, and connected to storage node SNT by pass transistor 15a, while the precharged (V$_{dda}$) voltage is applied to storage node SNB via pass transistor 15b. The write of cell 12 thus depends on the ability of these bit line voltages to counteract the drive of transistors 13p, 14n. If device imbalances within cell 12 prevent the "flipping" of its state, the write operation will fail and storage node SNT will remain latched at a high level despite the attempted write. In this sense, therefore, write failures are the converse of cell stability failures—a write margin failure occurs if a cell is too stubborn in changing its state, while a cell stability failure occurs if a cell changes its state too easily.

A read failure occurs if the SRAM cell provides insufficient current to the bit lines when accessed. Referring to FIG. 1a by way of example, the data state stored in cell 12 is communicated to bit lines BLT$_k$, BLB$_k$ upon word line WL$_j$ being energized to turn on pass transistors 15a, 15b, after bit lines BLT$_k$, BLB$_k$ are precharged to a high voltage. The one of storage nodes SNT, SNB that is latched to a low logic level pulls its corresponding bit line BLT$_k$, BLB$_k$ low, with a read current constituted by the one of transistor pairs (i.e., transistors 15a and 13n, or transistors 15b and 14n) that is turned on, establishing a differential bit line voltage. Device imbalances and the like can cause weakness in the drive by that n-channel pass gate/drive transistor pair, for example if the opposing p-channel transistors 13p, 14p only weakly turns on the cross-coupled n-channel drive transistors 14n, 13n, respectively, in its latched state.

BRIEF SUMMARY OF THE INVENTION

Embodiments of this invention provide a static memory in which cell stability, write margin, and read margin can be readily tested, and methods of testing such a memory for these attributes.

Embodiments of this invention provide such a memory and method in which the necessary circuit modifications are minimized.

Embodiments of this invention provide such a memory and method that require no modifications to the memory cell and array of cells for implementation, and thus which require no additional chip area within the memory array.

Embodiments of this invention provide such a memory, and corresponding method, in which the cell stability, write margin, and read margin can be readily tested using conventional automated test equipment and programs.

Embodiments of this invention provide such a memory and method that are compatible for both stand-alone memory devices and embedded memories within larger scale integrated circuits.

Other objects and advantages of embodiments of this invention will be apparent to those of ordinary skill in the art having reference to the following specification together with its drawings.

Embodiments of this invention may be implemented into a static memory in which memory cells are arranged in rows and columns, with cells in the same column sharing a pair of bit lines and residing in separately selectable rows. Precharge circuitry is provided to precharge each bit line prior to read or write cycles, for example to a high voltage. According to an aspect of this invention, opposite data states are written to a first memory cell in a column, and one or more other memory cells in that column. After the bit lines of the column are precharged, the precharge circuitry is disabled, and multiple pulses of a word line select signal are applied to the one or more other memory cells. The row containing the first memory cell is then selected, prior to precharge of the bit lines. Interrogation of the state of the first memory cell can give an indication of its cell stability, write margin, or read margin, depending on the particular sequence of the selection of the other memory cells in the column and the number of word line pulses.

BRIEF DESCRIPTION OF THE SEVERAL VIEWS OF THE DRAWING

FIG. 1b is a plot illustrating static noise margin for conventional SRAM memory cells such as the cell shown in FIG. 1a.

FIGS. 3a and 3b are electrical diagrams, in block form, of a memory in the integrated circuit of FIG. 2, constructed according to embodiments of the invention.

FIG. 6b is a flow diagram illustrating the operation of a search routine used in the procedure of FIG. 6a, according to embodiments of the invention.

FIG. 7b is a flow diagram illustrating the operation of a search routine used in the procedure of FIG. 7a, according to embodiments of the invention.

DETAILED DESCRIPTION OF THE INVENTION

This invention will be described in connection with its embodiments, namely as implemented into static random-access memory (SRAM), whether embedded into a larger-scale integrated circuit or as a stand-alone memory integrated circuit, because it is contemplated that this invention is especially beneficial when realized in such an application. However, it is also contemplated that this invention can be used to substantial advantage in other applications. Accordingly, it is to be understood that the following description is provided by way of example only, and is not intended to limit the true scope of this invention as claimed.

Figure 2:
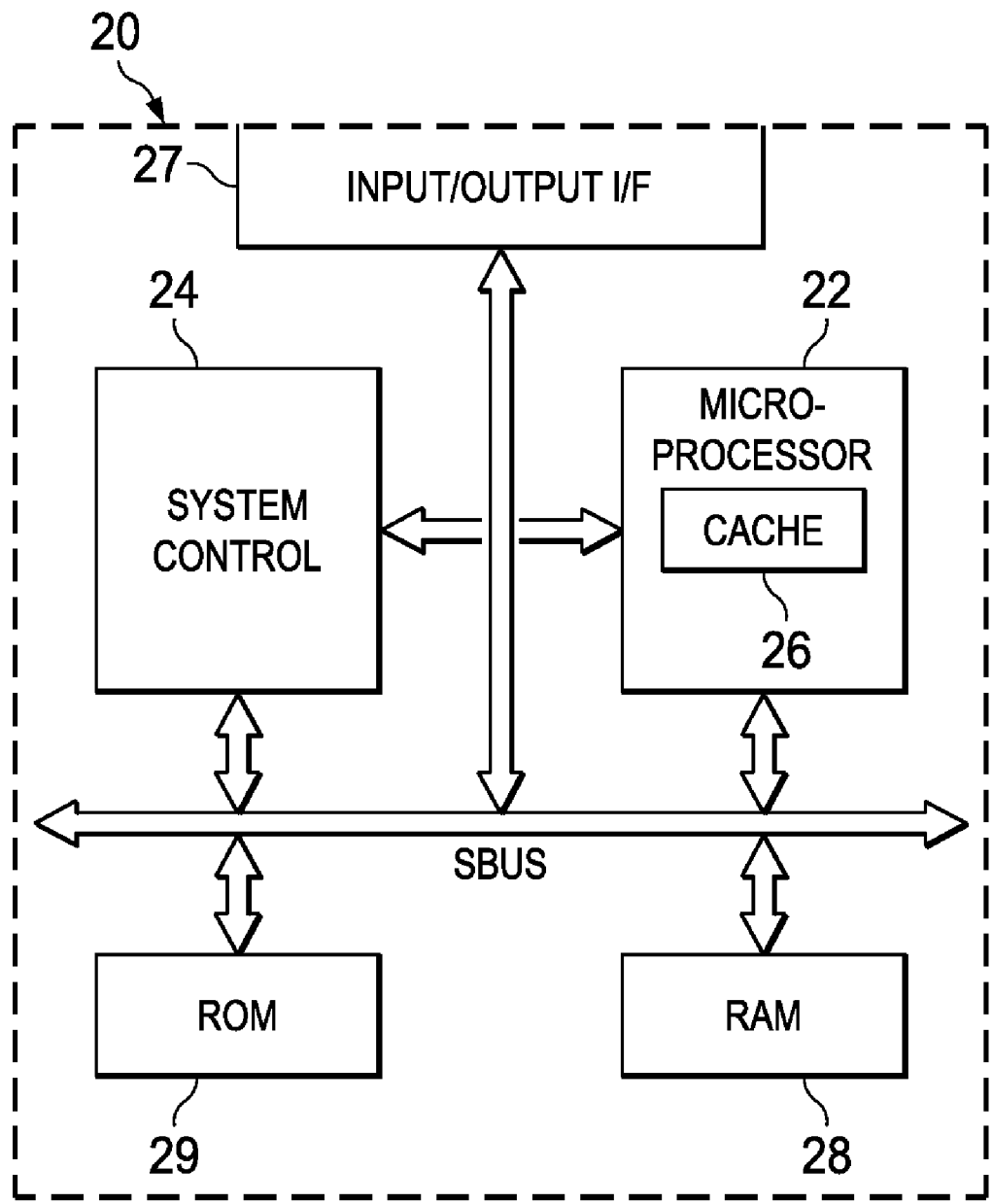
FIG. 2 is an electrical diagram, in block form, of a large scale integrated circuit constructed according to embodiments of the invention.

FIG. 2 illustrates an example of large-scale integrated circuit 20, in the form of a so-called "system-on-a-chip" ("SoC"), as now popular in many electronic systems. Integrated circuit 20 is a single-chip integrated circuit into which an entire computer architecture is realized. As such, in this example, integrated circuit 20 includes a central processing unit of microprocessor 22, which is connected to system bus SBUS. Various memory resources, including random access memory (RAM) 28 and read-only memory (ROM) 29, reside on system bus SBUS and are thus accessible to microprocessor 22. Typically, ROM 29 serves as program memory, storing the program instructions executable by microprocessor 22, while RAM 28 serves as data memory; in some cases, program instructions may reside in RAM 28 for recall and execution by microprocessor 22. Cache memory 26 is another memory resource, and resides within microprocessor 22 itself and therefore does not require bus access. Other system functions are shown, in a generic sense, in integrated circuit 20 by way of system control 24 and input/output interface 27.

Those skilled in the art having reference to this specification will recognize that integrated circuit 20 may include additional or alternative functions to those shown in FIG. 2, or may have its functions arranged according to a different architecture from that shown in FIG. 2. The architecture and functionality of integrated circuit 20 is thus provided only by way of example, and is not intended to limit the scope of this invention.

The construction of RAM 28 in integrated circuit 20 will now be described in further detail, with reference to FIG. 3a. Of course, a similar construction may be used to realize other memory resources, for example cache memory 26; further in the alternative, RAM 28 may correspond to a stand-alone memory integrated circuit (i.e., not an embedded memory as shown in FIG. 2). Those skilled in the art having reference to this specification will comprehend that the memory architecture of RAM 28 in FIG. 3a is provided by way of example only.

Figure 1A:
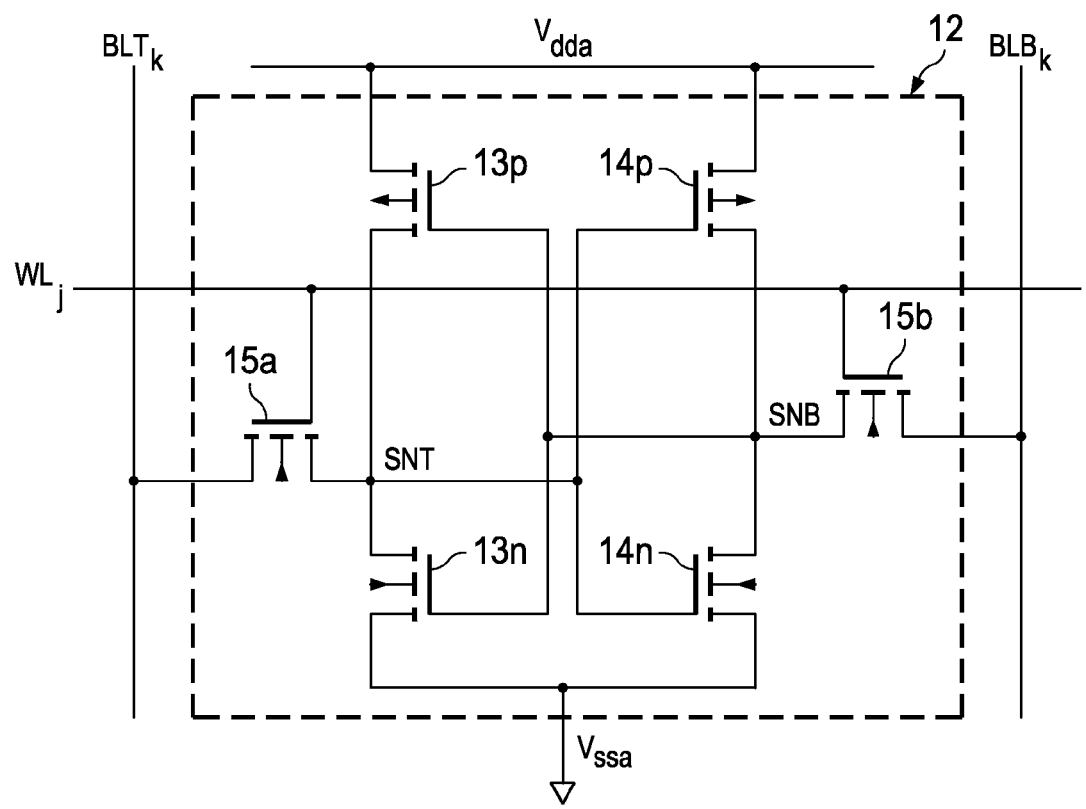
FIG. 1a is an electrical diagram, in schematic form, of a conventional SRAM memory cell.

In this example, RAM 28 includes many memory cells arranged in rows and columns within memory array 30. Each memory cell in this embodiment of the invention is constructed as a 6-T memory cell such as described above in connection with SRAM cell 12 of FIG. 1a; alternatives to such memory cells include SRAM cells with resistor loads rather than p-channel load transistors, ferroelectric static RAM (FeRAM) cells that are based on cross-coupled inverters, and the like. In this example, memory array 30 includes m rows and n columns of SRAM cells, with cells in the same column sharing a pair of bit lines BL[n−1:0], and with memory cells in the same row sharing one of word lines WL[m−1:0]. Bit line precharge circuitry 31 is provided to apply a desired precharge voltage to the pairs of bit lines BL[n−1:0] in advance of read and write operations. Row decoder 33 receives a row address value indicating the row of memory array block 30 to be accessed, and energizes the one of word lines WL[m−1:0] corresponding to that row address value. Read/write circuits 34, which may be realized as conventional sense amplifiers and write circuits as known in the art for SRAM devices, are coupled to bit lines BL[n−1:0] as shown. Column select circuit 32 receives a column address value, and in response selects one or more read/write circuits 34 for communication with bus DATA_I/O, by way of which output data and input data are communicated from and to the addressed memory cells within memory array 30, in the conventional manner.

Figure 3B:
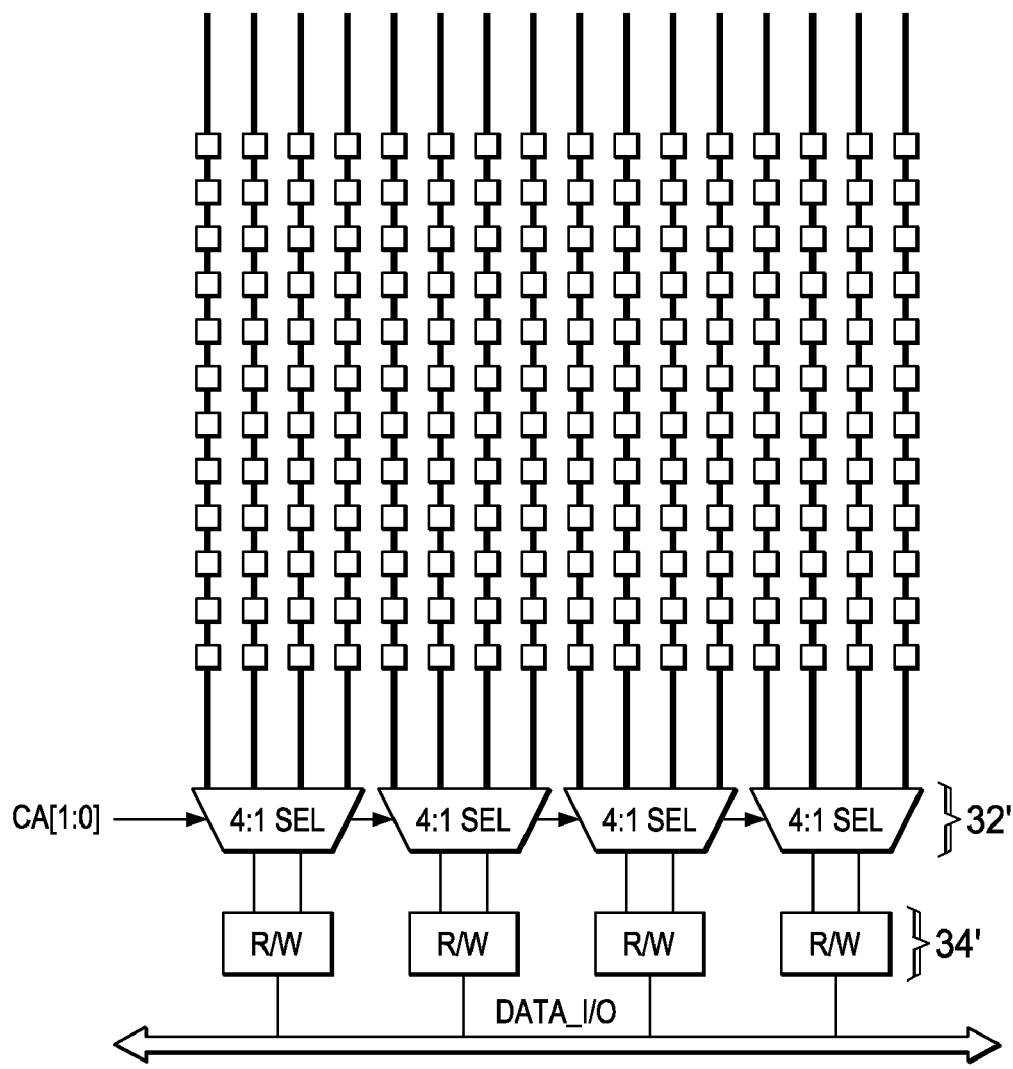
Figure 4:
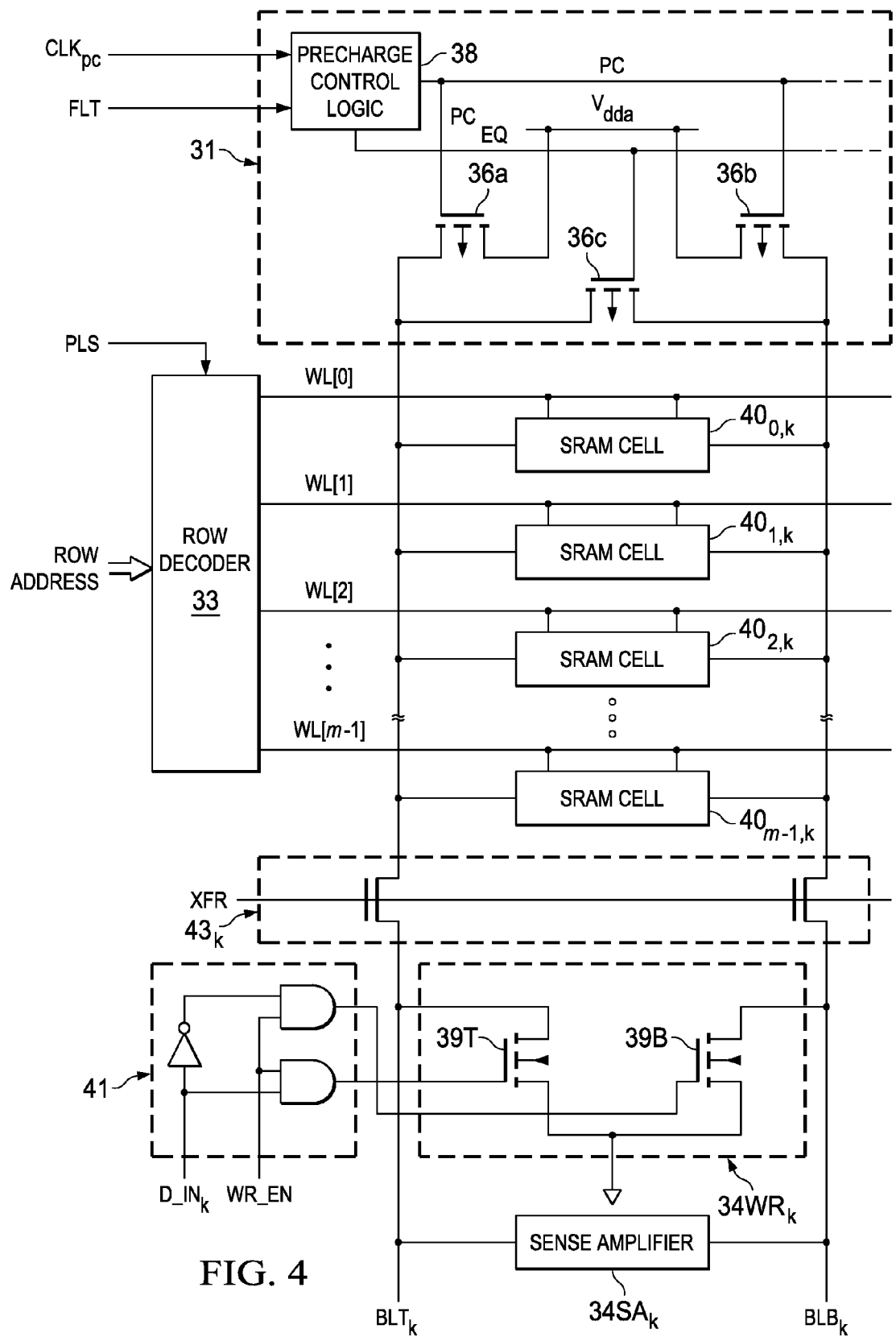
FIG. 4 is an electrical diagram, in block and schematic form, of a column of memory cells and associated precharge and read/write circuitry, in the memory of FIG. 3a according to embodiments of the invention.

Of course, many variations in the particular memory arrangement can be realized within this architecture, and by way of variations to this architecture, in connection with this embodiment of the invention. For example, as shown in FIG. 3b, 4:1 column select circuits 32' are placed between bit lines BL[n−1:0] and read/write circuits 34', and receive a portion of the column address. In this example, each column select circuit 32' is associated with a group of four columns, and with a single read/write circuit 34'. Each read/write circuit 34' includes a sense amplifier and the appropriate write circuit, and is in communication with data bus DATA I/O. In a read or write operation, each select circuit 32' selects one of its group of four columns for connection to its read/write circuit 34', according to the two least significant bits of the column address (CA[1:0]), thus multiplex multiple bit line pairs to its read/write circuit 34'. The bit line pairs for the unselected columns in its group are isolated from read/write circuit 34'. The arrangement of FIG. 3b is, of course, only one such variation, it being understood that many variations and architectures of RAM 28 may be used in connection with embodiments of this invention.

RAM 28 also includes or is in communication with test logic 35, which controls the operation of certain functions within RAM 28 in carrying out read stability, write margin, and read margin tests according to embodiments of this invention. Test logic 35 receives a mode control signal on line MODE, as issued by other control logic in integrated circuit 20 (e.g., system control 24 in FIG. 2), or from an external pin or pad, or in some other manner. Test logic 35 includes the appropriate logic to generate a control signal to bit line precharge circuitry 31 on line FLT, in response to which bit line precharge circuitry 31 floats bit lines BL[n−1:0] during certain test operations. In addition, test logic 35 issues a control signal to row decoder 33 on line PLS, in response to which row decoder 33 shortens its word line pulses in certain test operations. It is contemplated that those skilled in the art having reference to this specification, particularly the description of the test functions described below, will be readily able to construct and efficiently place test logic 35 within the integrated circuit containing RAM 28 to carry out those test functions.

FIG. 4 illustrates the construction of an example of precharge circuitry 31 in connection with a column of SRAM cells 40 in memory array 30. In this FIG. 4, SRAM cells $40_{0,k}$ through $40_{m-1,k}$ in this $k^{th}$ column of memory array share bit lines $BLT_k$, $BLB_k$. Cells $40_{0,k}$ through $40_{m-1,k}$ receive respective word lines WL[0] through WL[m−1] from row decoder 33; as described above, word line WL[j] turns on pass transistors in its associated cell $40_{j,k}$, to connect its storage nodes to bit lines $BLT_k$, $BLB_k$. Sense amplifier $34SA_k$ is connected to bit lines $BLT_k$, $BLB_k$, and is constructed in the conventional manner by way of a CMOS differential amplifier, amplifying the differential signal at bit lines $BLT_k$, $BLB_k$ for communication to output circuitry (not shown) in the conventional manner. Write circuitry $34WR_k$ is also provided for column k, with transistors 39T, 39B having their source-drain paths connected between bit lines $BLT_k$, $BLB_k$ and ground; the gates of transistors 39T, 39B are controlled by write logic 41, such that one of transistors 39T, 39B is turned on in a write cycle (control signal WR_EN active high), depending on the data state to be written as communicated on data input line $D\_IN_k$. Transistors 39T, 39B remain off during read cycles (signal WR_EN inactive low). Transfer devices $43_k$ are included in bit lines $BLT_k$, $BLB_k$ between cells 40, on one hand, and sense amplifier $34SA_k$ and write circuit $34WR_k$ on the other hand. Transfer devices $43_k$ are turned on by control signal XFR, for example as issued by column select 32 or other control circuitry within RAM 28, at the appropriate times in read and write cycles; at other times, transfer devices $43_k$ are held off to isolate bit lines $BLT_k$, $BLB_k$ from sense amplifier $34SA_k$ and write circuit $34WR_k$. Of course, those skilled in the art having reference to this description will recognize that additional circuitry such as multiplexers for multiplexing multiple columns into a single sense amplifier and write circuit, and the like may also be provided to this column of memory array 30, in the conventional manner.

As shown in FIG. 4 for column k, precharge circuitry 31 includes p-channel MOS transistors 36a, 36b with their source-drain paths connected between bit lines $BLT_k$, $BLB_k$, respectively, and power supply voltage $V_{dda}$. The gates of transistors 36a, 36b both receive precharge control signal PC from precharge control logic 38 in precharge circuitry 31. Also in this example, equalization transistor 36c has its source-drain path connected between bit lines $BLT_k$, $BLB_k$, and its gate receiving equalization control signal EQ from precharge control logic 38. Similarly, other columns in memory array 30 will be associated with instances of transistors 36a, 36b, 36c, also receiving precharge control signal PC and equalization signal EQ.

In normal read/write operation, precharge control logic 38 issues precharge control signal PC and equalization signal EQ in response to one or more clock signals $CLK_{pc}$. Precharge of bit lines $BLT_k$, $BLB_k$ is performed at the beginning of each normal read or write cycle, by precharge control logic 38 driving precharge control signal PC to an active low level, turning on transistors 36a, 36b and thus charging bit lines $BLT_k$, $BLB_k$ toward power supply voltage $V_{dda}$. After the precharge pulse ends (control signal PC returns inactive high), precharge control logic 38 issues an active low pulse of equalization control signal EQ, turning on transistor 36c so that bit lines $BLT_k$, $BLB_k$ settle to identical voltages. Bit lines $BLT_k$, $BLB_k$ are then ready for a read or write operation to one of its cells $40_{j,k}$, upon row decoder 33 energizing a word line WL[j] and connecting storage nodes in the selected cell $40_{j,k}$ for sensing by sense amplifier $34SA_k$, or to receive an input data state from write circuitry $34WR_k$, as the case may be.

According to embodiments of this invention, during certain operations in a special test mode, test logic 35 (FIG. 3a) issues a control signal on line FLT to precharge control logic 38. In response, precharge control logic 38 inhibits asserting active levels of the precharge control signal PC and equalization signal EQ during those operations, such that bit lines $BLT_k$, $BLB_k$ effectively "float", with transfer devices $43_k$ remaining off during these operations as well. As will be evident from the following description, the floating of bit lines $BLT_k$, $BLB_k$ allows cells 40 to discharge the bit line voltages, upon energizing of the corresponding word lines WL. As shown in FIGS. 2 and 3, test logic 35 also controls row decoder 33 via control signal PLS, so that short pulses of word lines WL are issued during this special test mode. As will now be described in detail, this circuitry and operation is useful in characterizing and testing various operational margins of RAM 28.

According to embodiments of this invention, RAM 28 constructed as described above can be operated in order to characterize its cell stability, write margin, and read margin. In addition, also according to these embodiments of the invention, this characterization can be performed in early stages of the product life cycle, for example to carry out a silicon "debug", such as if a larger-than-expected number of memories appear vulnerable to failing for one reason or another. The characterization and silicon debug of RAM 28 in connection with these various margins will now be described in detail, referring to FIGS. 5a through 5d for the case of characterizing and measuring the stability of memory cells 40 in RAM 28.

It is contemplated that the cell stability characterization and silicon debug method of this embodiment of the invention, as well as the other test methods described in this specification, may be carried out under the control of conventional automated test equipment, for example in response to a test program that is exercising integrated circuit 20. Alternatively, it is contemplated that RAM 28 may be tested in its eventual system implementation, whether RAM 28 is embedded within SoC integrated circuit 20, or installed as a stand-alone memory device. Those skilled in the art having reference to this specification will readily comprehend a test program or sequence for carrying out these tests, without undue experimentation.

Cell stability characterization begins in process 200, in which a cell to be tested (cell-under-test, or "CUT") within a sample of RAM 28 is selected. For purposes of characterization or silicon debug, it is of course not essential that every cell 40 within RAM 28 need be tested or characterized. The number of cells 40, and the number of samples of RAM 28, that are to be tested will depend on the nature of the overall characterization effort, and the statistical confidence level desired. As such, the characterization procedure of this embodiment of the invention will be described with reference to a single CUT, it being understood that this procedure will be repeated for other cells 40 within the same sample of RAM 28, and for other samples, as desired by the personnel carrying out the characterization. In any case, it is contemplated that selection process 200 will be executed by the automated test equipment or other external controlling source, by selection of the appropriate address of the CUT within RAM 28. According to this embodiment of the invention, stability for both data states will be characterized; in this example, the procedure continues with the setting of data state D to "0", in process 202. In process 204, a search routine is carried out to determine the stability margin of the CUT selected in process 200, for the "0" data state.

Figure 5A:
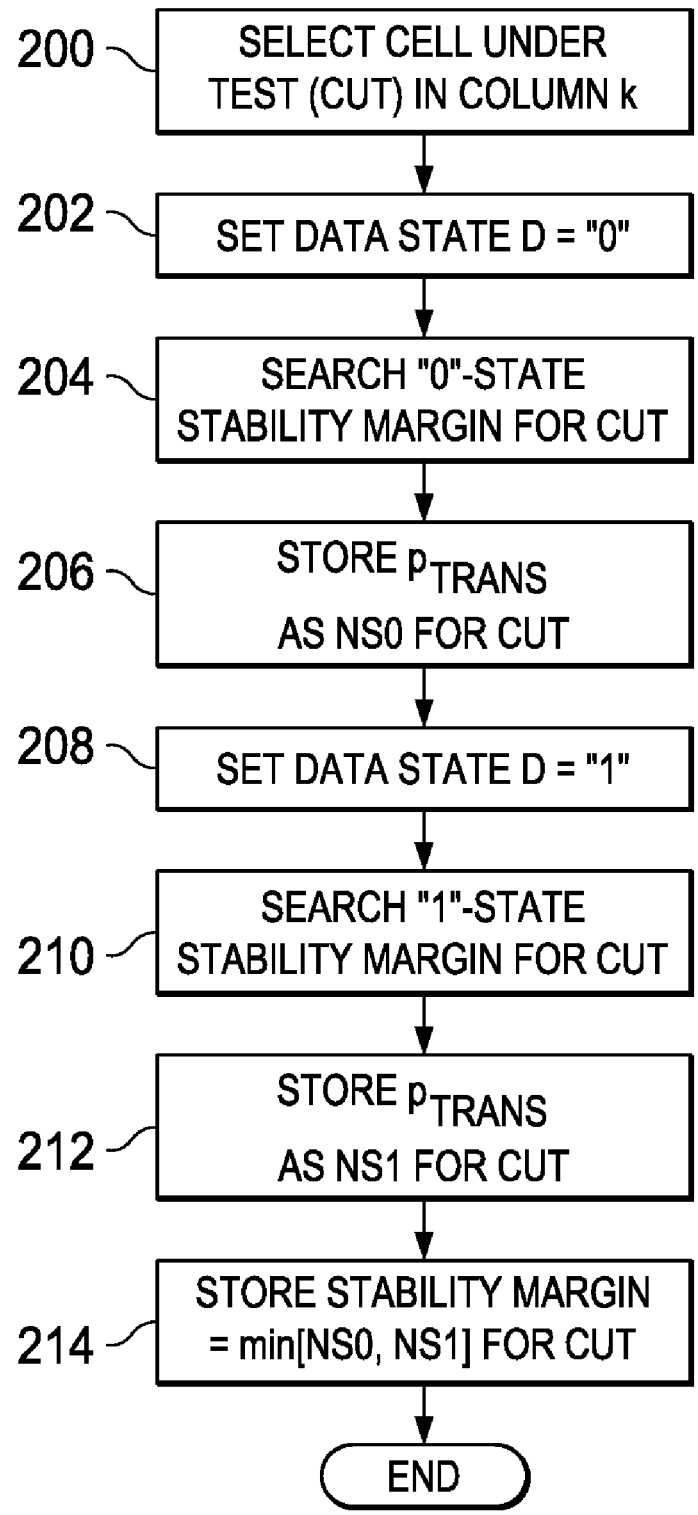
FIG. 5a is a flow diagram illustrating the operation of a cell stability characterization procedure according to embodiments of the invention.
Figure 5B:
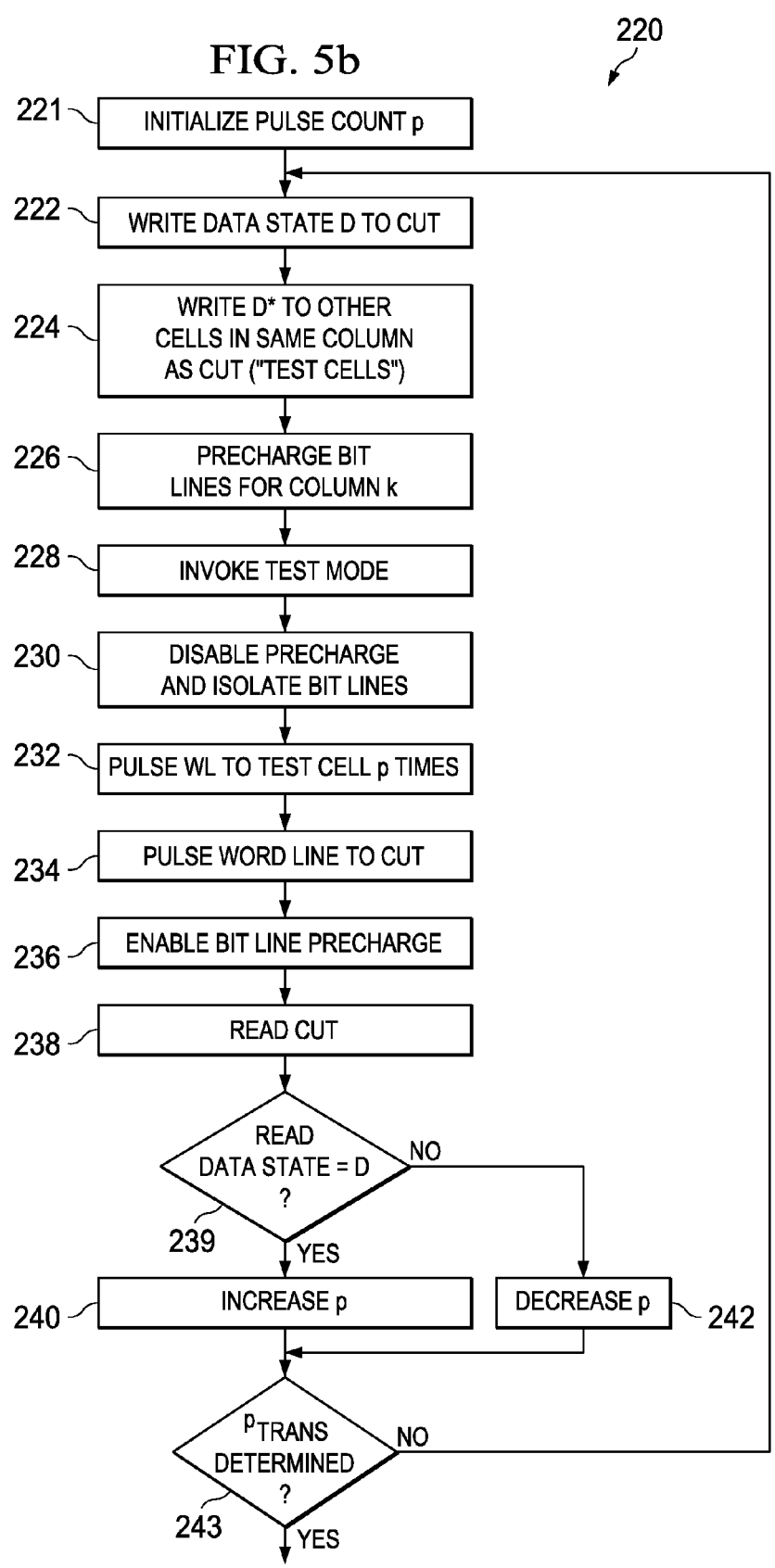
FIG. 5b is a flow diagram illustrating the operation of a search routine used in the procedure of FIG. 5a, according to embodiments of the invention.

Referring now to FIG. 5b, stability search routine 220, which carries out this stability characterization search for a given data state and for a given CUT according to an embodiment of this invention, will now be described in detail. In process 204 of course, as mentioned above, routine 220 of FIG. 5b is performed on the CUT selected in process 200 and for the "0" data state. For purposes of this description of routine 220, the selected CUT will be considered as located within column k.

Search routine 220 begins with process 221, in which a pulse count p is initialized. As will be evident from the following description, the particular value to which this pulse count p is initialized in process 221 depends on the search methodology being followed (e.g., binary search) and also perhaps upon past experience or simulation. In process 222, data state D ("0" in the case of process 204) is written to the CUT, by way of a conventional, or normal, write operation. Process 222, as well as other conventional or normal write operations referred to in this specification, may be conducted at a voltage level (e.g., power supply voltage $V_{dda}$ at its nominal voltage) that is different from the voltage level (e.g., $V_{dda}$ at its minimum operating voltage) at which the cell stability margin or other margin is characterized or tested. In process 224, other cells 40 in the same column k (but, of course, different rows) as the selected CUT are written with data state D* (i.e., the "1" data state in this example), also using conventional data write cycles. This process 224 may write data state D* ("1") to each and every other cell 40 in the same column k as the CUT, or may write data state D* ("1") to a subset of other such cells 40 in that column k. These cells 40 in the same column k, other than the CUT, will be referred to in this description of routine 220 as "test cells".

Figure 5C:
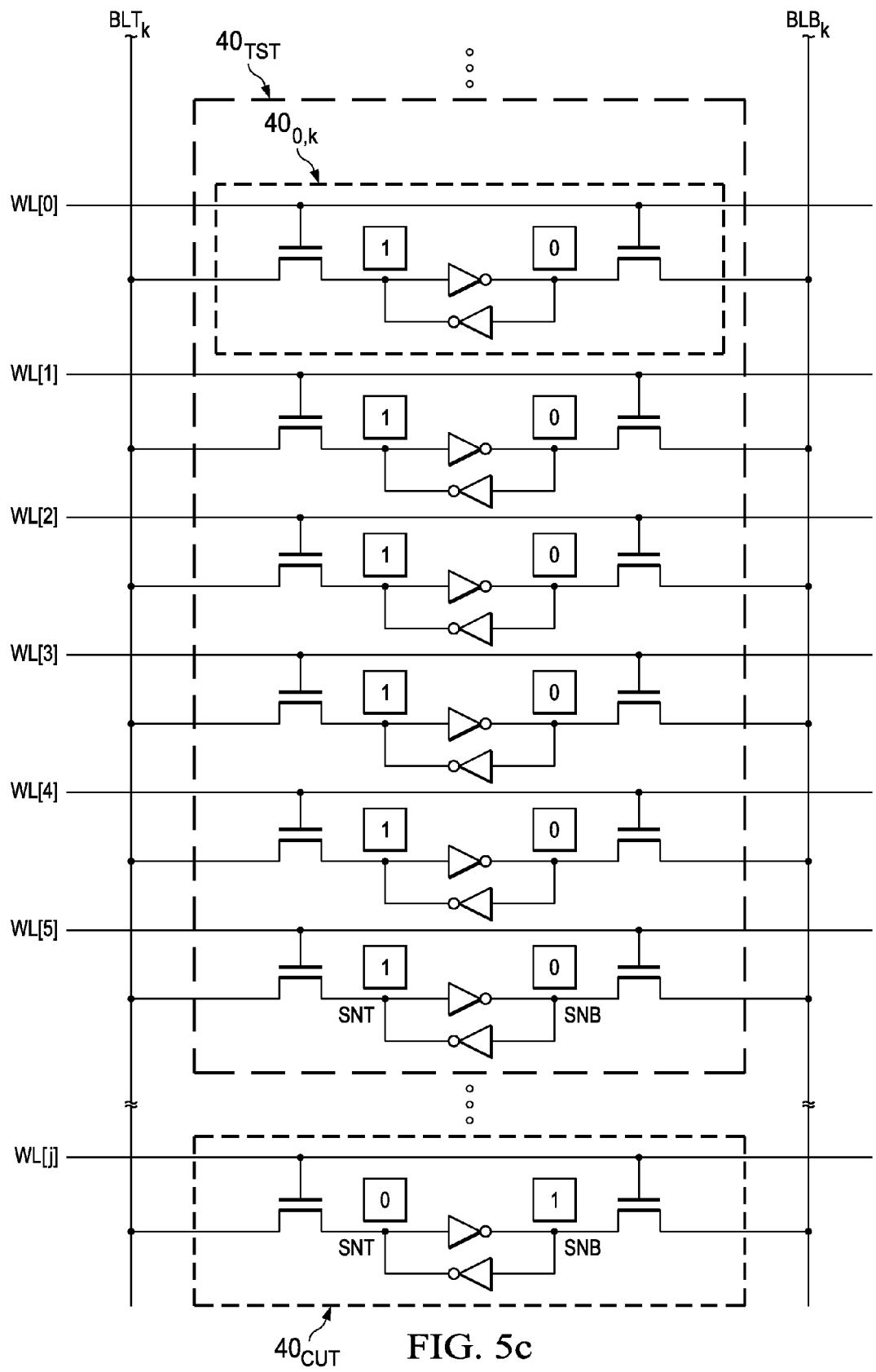
FIG. 5c is an electrical diagram, in block form, illustrating the state of a column of memory cells at a point in the cell stability procedure of FIG. 5a, according to embodiments of the invention.

The result of processes 222 and 224, in this embodiment of the invention, is illustrated schematically by way of FIG. 5c. In the column shown in FIG. 5c, cell under test $40_{CUT}$ is storing a "0" data state by way of its cross-coupled inverters; this "0" data state corresponds to a "1" level (high voltage) latched at its storage node SNB, and a "0" level (low voltage) latched at its storage node SNT. FIG. 5c also shows test cells $40_{TST}$, collectively, in this column k that each store a "1" data state as a result of process 48; this "0" data state corresponds to a "1" level (high voltage) latched at storage node SNT, and a "0" level (low voltage) latched at storage node SNB, in each of these test cells $40_{TST}$.

Referring back to FIG. 5b, once the data states in cells $40_{CUT}$, $40_{TST}$ are established by processes 222, 224 as shown in FIG. 5c, bit lines $BLT_k$, $BLB_k$ are precharged to a high voltage (e.g., power supply voltage $V_{dda}$) by precharge circuitry 31, in preparation for a normal mode cycle. In process 228, however, test mode is invoked by automated test equipment or another external control source applying the appropriate test mode enable signals or instruction codes to test logic 35 (FIG. 3a). After test mode is invoked in process 228, test logic 35 executes process 230 by issuing a control signal on line FLT to precharge circuitry 31 so that bit lines $BLT_k$, BLB$_k$ of column k under test are allowed to float, in isolation from being driven or pulled to any particular voltage.

In addition, in this test mode, bit lines BLT$_k$, BLB$_k$ are isolated from read/write circuits 34. For example, in the arrangement of FIG. 4, transfer gates 43$_k$ are held off by the appropriate control logic. In the arrangement of FIG. 3b, in which multiple pairs of columns are multiplexed to a single sense amplifier, isolation of bit lines BLT$_k$, BLB$_k$ can be easily performed by applying a column address of one of the other columns in each group, thus causing each 4:1 column select circuit 32' to select a column other than that containing the current cell under test 40$_{CUT}$ and test cells 40$_{TST}$. Following process 230 in this test mode, bit lines BLT$_k$, BLB$_k$ remain at the high precharge voltage (e.g., V$_{dda}$).

In process 232, row decoder 33 energizes one of the word lines WL[m−1:0] associated with one of test cells 40$_{TST}$ for a sequence of p brief pulses, where p is the pulse count initialized in process 221. Each pulse applied in process 232 is brief as compared with a full read or write cycle in normal operation, for example having a duration of about 300 psec, as compared with a 1.2 nsec duration of an energized word line in normal read or write operation. As shown in FIG. 3a, test logic 35 or other circuitry in RAM 28 issues a control signal on line PLS to row decoder in this test mode, indicating that the duration of the word line pulses is to be shortened from that in normal operation.

Each of the p word line pulses issued in process 232 is applied to a row containing a test cell 40$_{TST}$. During each of the p word line pulses, the storage nodes SNT, SNB of the test cell 40$_{TST}$ in column k and in the pulsed row are connected to bit lines BLT$_k$, BLB$_k$, respectively. Referring to FIG. 5c by way of example, during the time that word line WL[0] is pulsed in process 232, the "0" level latched (and driven) at storage node SNB of cell 40$_{0,k}$ will pull down the voltage of bit line BLB$_k$, from its previously precharged voltage. On the other hand, the "1" level at storage node SNT of cell 40$_{0,k}$ will not affect the voltage of bit line BLT$_k$. At the end of the short pulse of word line WL[0] in this example, bit line BLB$_k$ will then again float, remaining at the voltage to which it was pulled down by storage node SNB of test cell 40$_{0,k}$ in this instance of process 232.

Figure 5D:
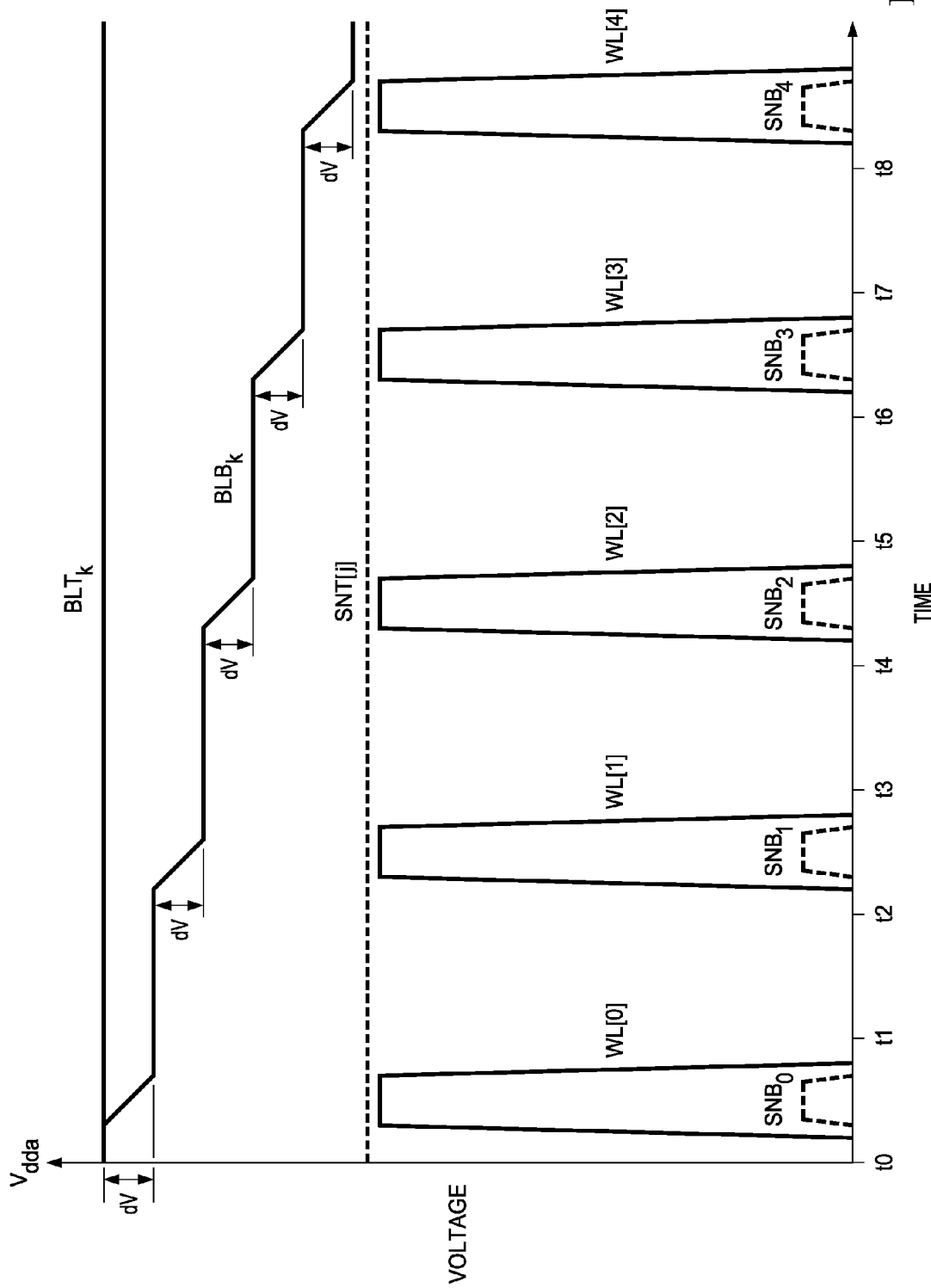
FIG. 5d is a timing diagram illustrating voltages during the cell stability test of FIG. 5a, according to embodiments of the invention.

The number of these short word line pulses indicated by the current pulse count value p, in combination with the duration of each pulse, determines the extent to which bit line BLB$_k$ is discharged in process 232. FIG. 5d illustrates the effect of the multiple repetitions of process 232 on the voltage of bit line BLB$_k$ in this example. At time t0, before the first pulse of process 232, bit lines BLT$_k$, BLB$_k$ are at their precharged voltage at or near power supply voltage V$_{dda}$. In the time interval between times t0 and t1, word line WL[0] is pulsed high for a short duration, for example on the order of about 300 psec, during which storage node SNB$_0$ is connected to bit line BLB$_k$ (see FIG. 5c). This pulls the voltage of bit line BLB$_k$ down by an increment shown in FIG. 5d as voltage dV; during this pulse, as shown in FIG. 5d, storage node SNB$_0$ is pulled toward the voltage at bit line BLT$_k$, but then is pulled back to its low level by the action of the latch within cell 40$_{0,k}$ as word line WL[0] returns low. After the end of the pulse at word line WL[0], the voltage of bit line BLB$_k$ remains floating at the reduced level. Each subsequent pulse at word lines WL[1], WL[2], WL[3], et seq. pulls the voltage at bit line BLB$_k$ lower by (on the average) voltage dV as shown. It is contemplated that the sequence of word line pulses will be applied to different rows of test cells 40$_{CUT}$, rather than to the same row repeatedly. Meanwhile, as mentioned above, the voltage of bit line BLT$_k$ remains essentially at its precharged level, because storage node SNT of each test cell 40$_{TST}$ is latched to a "1" level.

Referring back to FIG. 5b, once bit line BLB$_k$ in this example is discharged by way of the p word line pulses, process 234 is then performed by row decoder 33 energizing the word line for the row containing cell under test 40$_{CUT}$ (e.g., word line WL[j] of FIG. 5c). This process 234 is performed while precharge circuitry 31 remains disabled, with bit lines BLT$_k$, BLB$_k$ floating. The duration of this energizing of word line WL[j] to cell 40$_{CUT}$ is contemplated to be essentially on the order of a normal write cycle word line cycle. This selection of a longer word line pulse, in the special test mode, may be made by automated test equipment or another external source, for example by asserting a write enable control signal while RAM 28 is in the test mode; that selection may be communicated by test logic 35 to indicate to row decoder 33. Alternatively, word line WL[j] may be asserted, in process 234, for the same shortened duration as in each instance of process 232. In any case, the row address of the current cell under test 40$_{CUT}$ will be asserted by automated test equipment or the other external source, as the case may be, to select the appropriate word line WL[j]. The effect of process 234 is to apply the discharged bit line voltage to storage node SNB in cell under test 40$_{CUT}$, to determine whether this voltage is sufficient to change the state of cell under test 40$_{CUT}$, which is currently at a "0" level as shown in FIG. 5c. In effect, process 234 attempts a "write" using this discharged bit line BLB$_k$ voltage. As mentioned above, bit line BLT$_k$ was not discharged to any substantial degree by the repeated word line pulses, because storage node SNT in each test cell 40$_{TST}$ is at a "1" level. Because bit line BLT$_k$ remains at or near its precharge voltage, the stability of cell under test 40$_{CUT}$ can be more precisely evaluated.

After the attempted "write" of process 234, bit line precharge is again enabled by precharge circuitry 31, in process 236, for example by de-asserting the test mode at test logic 35. In process 238, the state of cell under test 40$_{CUT}$ is read by way of a normal read operation, to determine whether the state of cell under test 40$_{CUT}$ has changed as a result of the p word line pulses applied in process 232 and the "write" of process 234. Process 238, as well as other conventional or normal read operations referred to in this specification, may be conducted at a voltage level (e.g., power supply voltage V$_{dda}$ at its nominal voltage) that is different from the voltage level (e.g., V$_{dda}$ at its minimum operating voltage) at which the cell stability margin or other margin is characterized or tested. The data state read in process 238 is then compared against the original "0" data state originally written to cell under test 40$_{CUT}$, in decision 239.

The goal of routine 220 is to determine the lowest value of pulse count p that causes cell under test 40$_{CUT}$ to change state (in other words, the highest value of pulse count p that cell under test 40$_{CUT}$ can tolerate without changing state); that critical pulse count value will be referred to as p$_{TRANS}$. In routine 220 according to this embodiment of the invention, pulse count p is adjusted depending on the result of comparison decision 239. If data state D read in process 238 is the same as that written in process 222 (i.e., "0" in this instance of process 204), decision 239 returns a "yes" result indicating that cell under test 40$_{CUT}$ did not change state. Process 240 is executed to increase pulse count p. If cell under test 40$_{CUT}$ did change state (decision 239 returns a "no"), process 242 is executed to decrease pulse count p. The size of the increase or decrease of pulse count p applied in processes 240, 242, respectively, depends on the particular search algorithm being applied; for example, if a binary search is being performed, the amount of the increase or decrease will depend on the increase or decrease in the previous iteration within the bounds of the search range, as known in the art. In either case, decision 243 is executed to determine whether the search is complete because the transition pulse count value $p_{TRANS}$ has been determined. For example, decision 243 may simply determine whether the new pulse count p after process 240 or 242 has been previously tested. If not (decision 243 is "no"), then routine 220 is repeated beginning with process 222, for the new pulse count value p. If transition pulse count value $p_{TRANS}$ has been determined, routine 220 is complete and control passes to process 206 (FIG. 5a), in which that transition pulse count value $p_{TRANS}$ is stored in memory (e.g., of the automated test equipment) as stability margin NS0, corresponding to "0" state cell stability for cell under test $40_{CUT}$.

The characterization procedure continues to evaluate stability for the opposite data state, beginning with process 208 in which data state D is set to the "1" state. In process 210, routine 220 is repeated for the same CUT as selected in process 200, but for the opposite "1" data state as set in process 208. The resulting transition pulse count $p_{TRANS}$ from process 210 is stored in memory as stability margin NS1, for the CUT selected in process 200. Of course, because the true stability margin corresponds to the worst case stability for the two data states, the stability margin for the CUT selected in process 200 is the lesser of the margins NS0, NS1; this stability margin is stored in memory in association with the current CUT, in process 214.

As mentioned above, the characterization procedure of FIG. 5a may be repeated for other cells 40, and for other samples of RAM 28, to the extent desired for the type of characterization or silicon debug being performed. As evident from this description, the stability of cells 40 in RAM 28 can be readily evaluated according to embodiments of this invention. This cell stability, or static noise margin, test capability provides a precise determination of the stability margin, by its control of the number of repetitions of test cell access for each cell. As evident from this description, cell stability can be easily evaluated using conventional automated test equipment, for memories either or both in wafer form and also after packaging, and for stand-alone memories as well as embedded RAM. In addition, because of its pulsing of individual rows, the instantaneous power consumed by the stability test is kept to a minimum, allowing the circuitry to be designed for the power consumed in normal operation rather than for higher levels of power used only in test.

Figure 6A:
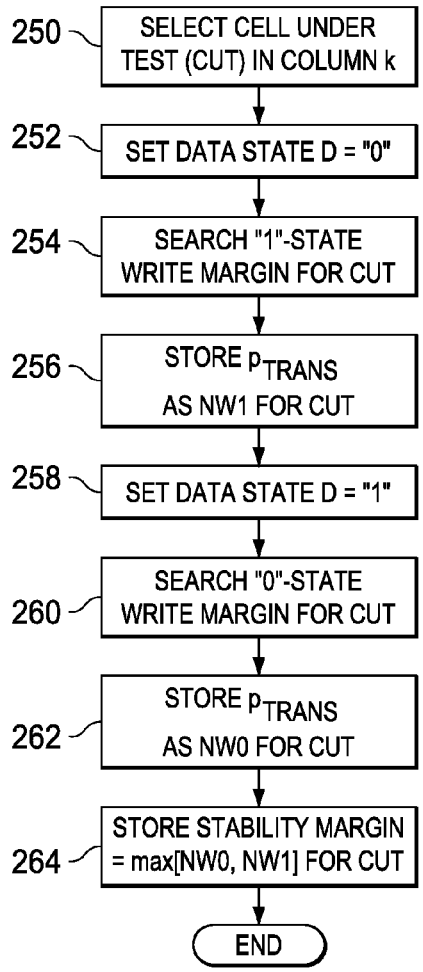
FIG. 6a is a flow diagram illustrating the operation of a write margin characterization procedure according to embodiments of the invention.

Referring now to FIG. 6a, a procedure for characterization or silicon debug in connection with the write margin of cells 40 within RAM 28, according to embodiments of this invention, will now be described in detail. As known in the art, for memories such as RAM 28 in which write cycles are performed by write circuitry pulling down one of the two bit lines $BLT_k$, $BLB_k$ to a low voltage such as ground ($V_{ssa}$), write margin refers to the highest bit line voltage that will still cause a successful write. In this embodiment of the invention, the write margin test may be considered as an "opposite" of the cell stability test, in that good write margin is reflected by a cell that can easily change state in response to a low voltage at a bit line. As such, many of the steps in this write margin characterization procedure will be similar to those described above for cell stability characterization. Similarly as described above, the write margin test of this embodiment of the invention can be readily executed under the control of automated test equipment or another external controller or signal source.

As shown in FIG. 6a, the write margin test begins with the selection of a cell under test (CUT) in process 250. As described above, in this characterization or silicon debug mode, the number of CUTs evaluated according to this procedure will depend on the purpose for the characterization effort; development of a statistical distribution of write margin will require a reasonable number of cells 40 in a number of samples of RAM 28, while silicon debug may be carried out on a much smaller number of cells 40, if not a single cell 40 that has been identified as electrically marginal. In process 252, the initial data state D is set to a "0" value. In process 254, a search routine is then executed on the CUT selected in process 250, for the case of writing a "1" level to a CUT that is storing a "0" data state. FIG. 6b illustrates the operation of search routine 270, by way of which the write margin for a given CUT storing a data state D is determined. As in the stability search routine of FIG. 5b described above, search routine 270 of this embodiment of the invention identifies a transition pulse count $p_{TRANS}$ that is the lowest pulse count that causes the CUT to change state (or, alternatively, the highest pulse count that does not cause the CUT to change state).

Routine 270 begins with process 271, in which pulse count p is initialized to a selected value. As in the stability routine, this initial pulse count p depends on the manner in which the search of transition pulse count $p_{TRANS}$ is to be carried out (e.g., binary search). In process 272, the current data state D is written to the CUT by way of a normal write cycle; in this case, in which routine 270 is being executed in process 254 (FIG. 6a), a "0" level is written into the CUT selected in process 250, which for purposes of this description, corresponds to cell under test $40_{CUT}$ in column k, similarly as shown in FIG. 5c.

In process 274, the opposite data state D* (which is a "1" state in this example) is written by way of a normal write cycle to each of test cells $40_{TST}$, which are cells in the same column k as cell under test $40_{CUT}$. Process 276 next precharges bit lines $BL_{Tk}$, $BL_{Bk}$ of column k, and the special test mode is invoked in process 278. Bit lines $BL_{Tk}$, $BL_{Bk}$ are floated, remaining initially at their precharged level, by the disabling of precharge circuitry 31 and the resulting isolation of bit lines $BL_{Tk}$, $BL_{Bk}$ in process 280.

In process 282, p repeated shortened word line pulses are now issued to the rows containing test cells $40_{TST}$. For the case in which this write margin test is being applied to a cell with poor write margin, this pulse count p will generally be greater than the pulse count used in the cell stability characterization routine described above, as applied to a cell with poor stability margin. This is because the determination of write margin discharges bit line $BLB_k$ (in this example in which a "1" state is to be written to a CUT previously storing a "0" state) to a voltage that is below the normal trip voltage (i.e., the voltage of the "1" storage-node-side bit line at which the cell starts to change state). The eventual voltage to which bit line $BLB_k$ is discharged by the p word line pulses applied in process 282 will be above the usual or nominal write voltage (e.g., $V_{ssa}$), as this characterization routine is investigating the "margin" above the normal bit line write voltage to determine the noise that can be tolerated by cell under test $40_{CUT}$ during a write operation. As in the case of the cell stability test, bit line $BLT_k$ is not discharged to any substantial degree by the repeated word line pulses, because storage node SNT in each test cell $40_{TST}$ is at a "1" level. Because bit line $BLT_k$ remains at or near its precharge voltage, the write margin of cell under test $40_{CUT}$ can be more precisely evaluated according to this embodiment of the invention.

After the p word line pulses have been applied in process 282, row decoder 33 energizes the word line WL[j] associated with cell under test $40_{CUT}$, in process 284, to perform a write operation; but this "write" is performed without precharging bit lines $BLT_k$, $BLB_k$ and without using write circuitry $34WR_k$. Rather, the discharged voltage at bit line $BLB_k$ is applied to storage node SNB of cell under test $40_{CUT}$ in process 284, to test whether that voltage is sufficient to change the stored state. It is useful that the duration of the energizing of word line WL[j] in process 284 correspond to that of a normal mode write cycle. Following write process 284, normal mode is then again invoked, bit lines $BLT_k$, $BLB_k$ are precharged to their normal high voltage in process 286, and the state of cell under test $40_{CUT}$ is read in process 288, by way of a normal read cycle.

Decision 289 determines whether the data state read in process 288 indicates that cell under test $40_{CUT}$ changed states due to process 284. If not (decision 289 is "yes", in that the same data state D remains in the CUT), pulse count p is increased in process 290, because bit line $BLB_k$ in this case must be discharged lower in order to cause the change of state. If cell under test $40_{CUT}$ changed states as a result of processes 282, 284 (decision 289 is "no"), pulse count p is decreased in process 292. The extent to which pulse count p is increased or decreased in processes 290, 292 depends on the particular search strategy being followed, as well as on the range of pulse count p values. Decision 293 then determines if transition pulse count $p_{TRANS}$ has been determined to the desired resolution (e.g., determining whether the new pulse count p has already been tried); if not (decision 293 is "no"), procedure 270 is repeated for the new pulse count p, from process 272. If so (decision 293 is "yes"), process 254 (FIG. 6a) is complete, and transition pulse count $p_{TRANS}$ is stored in memory as write margin value NW1 for the current CUT.

The write margin of the CUT for the opposite data state is then evaluated, beginning with process 258 in which the current data state D is set to "1". In process 260, routine 270 is again executed, but for this opposite data state D="1" (i.e., attempting to write a "0" into the CUT storing a "1"). Upon completion, transition pulse count $p_{TRANS}$ resulting from process 260 is stored in memory as write margin value NW0 for this CUT. Characterization of the CUT is then completed, by identifying and storing the write margin of this CUT as the larger of its write margin values NW0, NW1, which corresponds to the lower of the two bit line voltages required for a change in state.

According to this embodiment of the invention, therefore, write margin characterization can be performed using the same circuitry as used in performing the cell stability test, differing only in the number of repetitions of word line pulses to the test cells, and in the criteria for determining the margins from the "0" and "1" states. It is contemplated, of course, that the specific conditions under which the cell stability and write margin characterization are performed may also differ, if desired. In any case, it is contemplated that the write margin test of FIG. 6 can be readily performed by automated test equipment, on memories either or both in wafer form or after packaging, and on both stand-alone memory devices as well as embedded RAM.

Figure 7A:
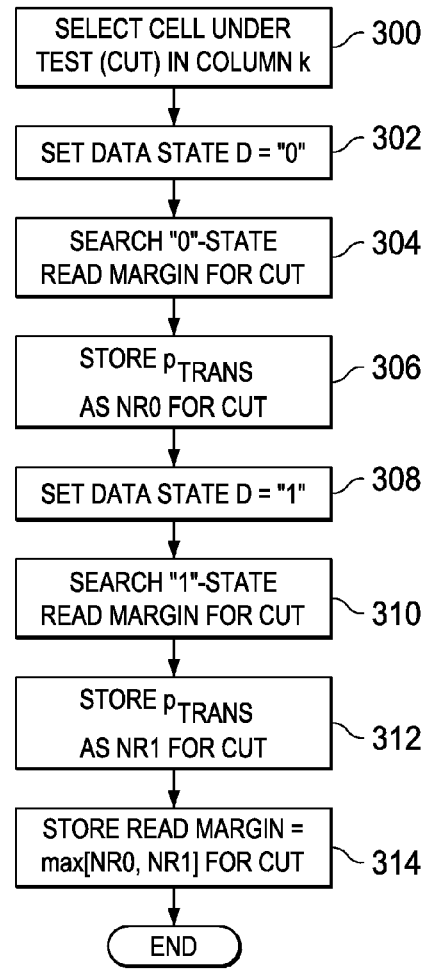
FIG. 7a is a flow diagram illustrating the operation of a read margin characterization procedure according to embodiments of the invention.

RAM 28 according to embodiments of this invention is also well-suited for the performing of a read current margin test, as will now be described in connection with FIGS. 7a and 7b. As known in the art, the read current margin of an SRAM cell refers to the current that can be drawn by its n-channel pass gate/driver transistor pair connected to the "0" level storage node in a read operation, in pulling down its precharged bit line when selected for a read. Strong read current drive of this transistor pair serves to develop a strong differential bit line voltage in the read cycle, and thus adequate margin against noise coupling to the bit lines or sense amplifier.

As in the case of the cell stability and write margin tests described above, it is contemplated that this read current margin test can be readily executed under the control of automated test equipment or another controller external to RAM 28. And also, as in the case of the read stability and write margin tests, a single SRAM cell in RAM 28 may be tested at a time, or multiple cells may be simultaneously tested (up to one per column, depending on the architecture), as it is contemplated that the mechanisms involved in the read margin test operate independently from column to column.

Figure 1B:
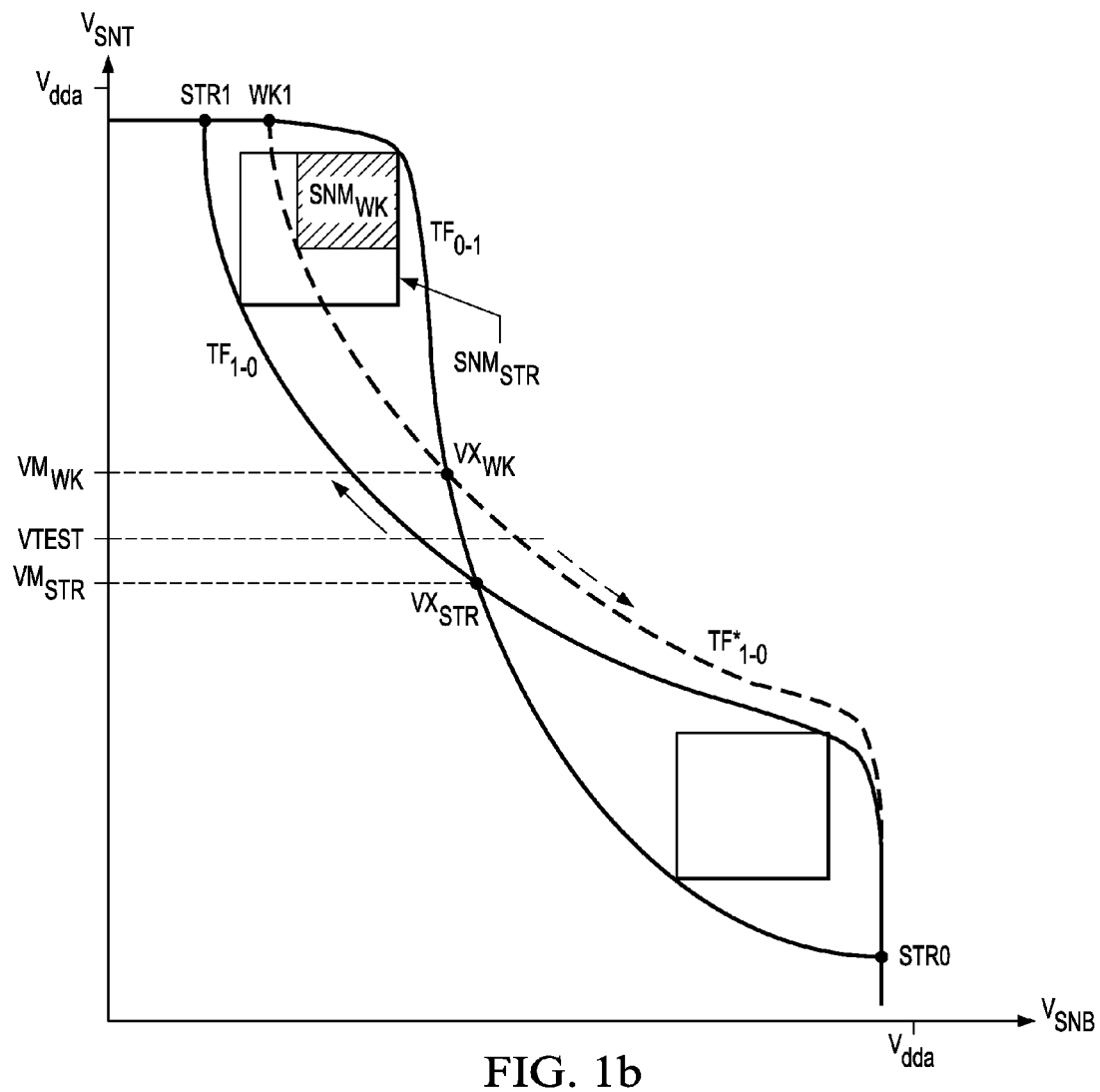

The construction of static memories according to embodiments of this invention, for example as described above for RAM 28, also allows for characterization and silicon debug of the read current margin, or simply read margin, of cells 40 in samples of RAM 28. A characterization procedure for determining read margin according to embodiments of this invention will now be described in connection with FIGS. 7a through 7c. In a general sense, read margin is characterized by identifying a number of brief word line pulses, each connecting the cell under test (CUT) to floating bit lines, that is sufficient to cause a reference cell in the same column to change its state. This number of pulses is indicative of the strength of the read current drawn by the conducting pass gate/driver transistor pair (i.e., transistors 15a and 13n, or transistors 15b and 14n, in FIG. 1b) of cell 40 for the current data state D.

Read margin characterization begins with process 300 in which a cell in RAM 28 to be tested is selected as the CUT. In process 302, data state D is set at "0", for purposes of search process 304. Search process 304 executes an instance of a characterization search routine, an example of which will be described in detail in connection with routine 320 of FIG. 7b.

Figure 7C:
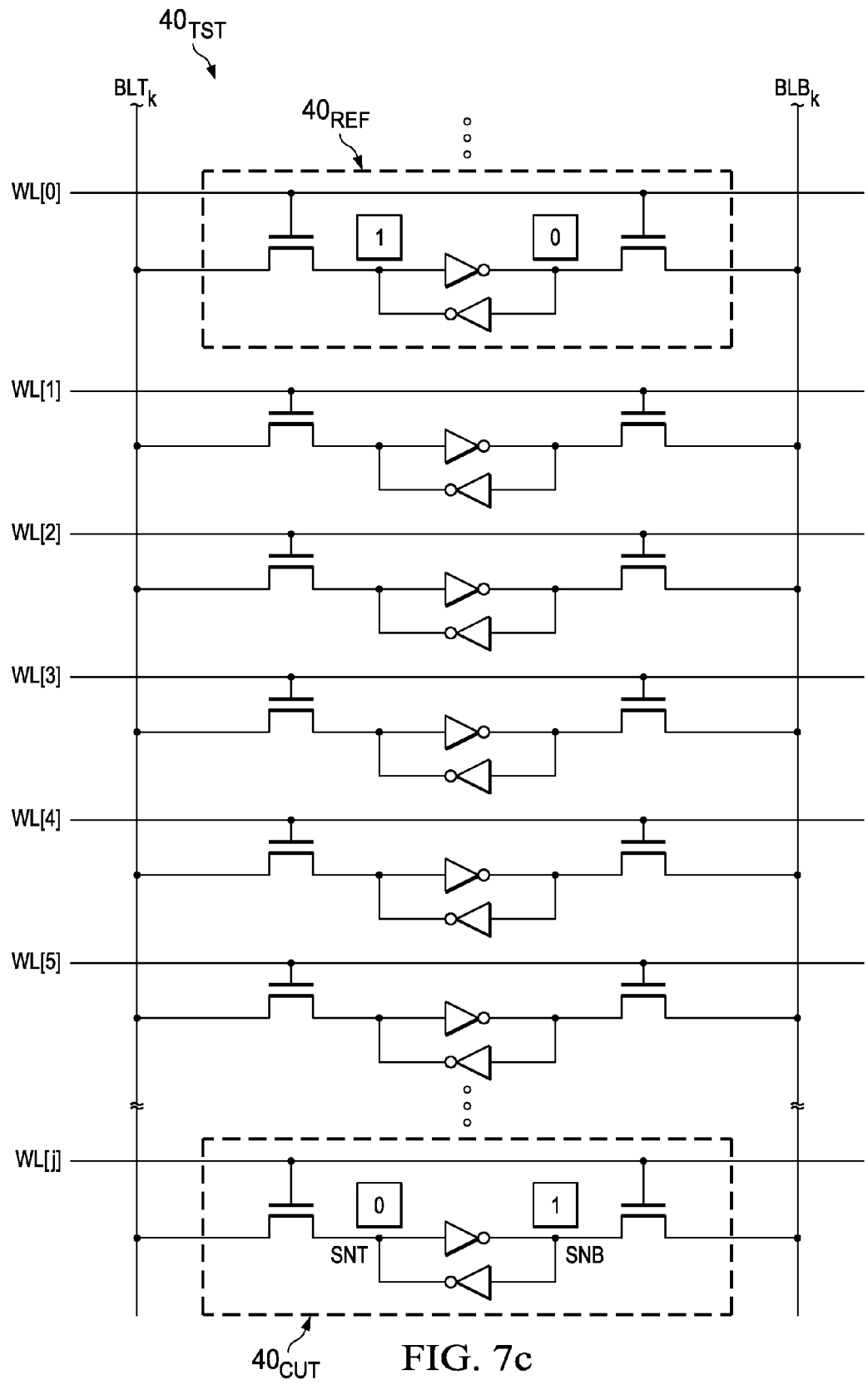
FIG. 7c is an electrical diagram, in block form, illustrating the state of a column of memory cells in the read margin procedure of FIG. 7a, according to embodiments of the invention.

Routine 320 begins with process 321, in which an initial value of pulse count p is selected. As in the other characterization routines described above, the value initialized in process 322 depends on the particular search approach being followed (e.g., binary search). In process 322, the CUT selected in process 300 is written with data state D, which in this case is "0" as set in process 302. In process 324, the opposite data state D* (a "1" in this case) is written to another cell 40 in the same column as the CUT. The write operations of processes 322, 324 are carried out by way of normal mode write cycles. FIG. 7c illustrates an example of column k at the point in time following processes 322, 324. As shown in FIG. 7c, cell under test $40_{CUT}$ is storing a "0" level, resulting from the write of process 322. Reference cell $40_{REF}$ is the other cell 40 in column k that is written with the opposite "1" data state in process 324. In this read margin characterization routine 320, only one reference cell $40_{REF}$ is required; the particular data states stored in other cells 40 of column k are not important.

Referring back to FIG. 7b, in connection with column k as shown in FIG. 7c, bit lines $BLT_k$, $BLB_k$ are then precharged to a high voltage such as power supply voltage $V_{dda}$, in process 326. In process 328, the test mode is invoked by way of communicating the appropriate test mode signal to test logic 35, which issues a control signal on line FLT that disables precharge circuitry 31 and isolates bit lines $BLT_k$, $BLB_k$, in process 330. Bit lines $BLT_k$, $BLB_k$ thus float at their previously precharged high voltage. In process 332, word line WL[j] for the row associated with cell under test $40_{CUT}$ is pulsed p times while bit lines $BLT_k$, $BLB_k$ are floating; each pulse is preferably for a shortened duration relative to a normal read operation. In each pulse of word line WL[j] in process 332, storage nodes SNT, SNB of cell under test $40_{CUT}$ are connected to bit lines $BLT_k$, $BLB_k$, respectively, which in this case discharges bit line $BLT_k$ by an incremental voltage dV, in similar manner as shown in FIG. 5d described above.

Upon completing the number of pulses of word line WL[j] indicated by pulse count p, the word line for the row containing reference cell $40_{CUT}$ is energized in process 334. In the example of FIG. 7c, this is accomplished by row decoder 33 energizing word line WL[0] for the row containing reference cell $40_{REF}$, and connects bit lines $BLT_k$, $BLB_k$ to storage nodes SNT, SNB of reference cell $40_{REF}$. During process 334, the voltage of bit line $BLT_k$ voltage, as discharged by the p pulses of word line WL[j], is connected to storage node SNT of reference cell $40_{REF}$. The duration of the energizing of the word line in process 334 may be longer than the pulses of process 332, for example of the same duration as the word line is energized in a normal write cycle.

In process 336, the test mode is exited and bit lines $BLT_k$, $BLB_k$ are precharged to their normal high voltage. Following precharge process 336, reference cell $40_{REF}$ is read in process 338, by way of a normal read cycle. As mentioned above, the state of reference cell $40_{REF}$ as read in process 338 indicates whether the read current drawn by cell under test $40_{CUT}$ in the p pulses of its word line WL[j] in process 332 is sufficiently strong, for that number p of word line pulses, to have changed the state of reference cell $40_{REF}$. If not (decision 339 is "no"), pulse count p is increased in process 340; if so (decision 339 is "yes"), pulse count p is decreased in process 342. As before, the amount of the increase or decrease applied by processes 340, 342, respectively, follows the search strategy being used in routine 320. In either case, decision 343 determines whether the transition pulse count $p_{TRANS}$ is determined (e.g., by determining whether the new pulse count p has previously been evaluated in routine 320). If not, routine 320 is repeated for the new pulse count p beginning from process 322. If so (decision 343 is "yes"), routine 320 is complete for this cell under test $40_{CUT}$, and transition pulse count $p_{TRANS}$ is stored in memory as read margin NR0 for this CUT.

In process 308, the opposite data state D="1" is set, and routine 320 is executed again for this opposite data state, in process 310. The value of transition pulse count $p_{TRANS}$ obtained for this data state D="1" in process 310 is stored in memory as read margin NR1 for this CUT, in process 312. Because a poorer read margin will be reflected as a higher value of transition pulse count $p_{TRANS}$, the read margin for the current CUT is identified as the larger of read margin values NR0, NR1, in process 314, and is stored in memory as the read margin for this CUT.

As discussed above, additional cells 40 within this sample of RAM 28, or cells 40 in other samples of RAM 28, may then be evaluated in similar manner, depending on the nature of the characterization or silicon debug task being carried out.

According to this embodiment of the invention, the read current margin of cells 40 in RAM 28 can be readily evaluated, using conventional automated test equipment, for memories either or both in wafer form and also after packaging, and for stand-alone memories as well as embedded RAM. In addition, the instantaneous power consumed by the stability test is kept to a minimum, allowing the circuitry to be designed for the power consumed in normal operation rather than for higher levels of power used only in test.

As evident from the foregoing, embodiments of this invention are well-suited for precisely characterizing and debugging static memory devices and embedded memories to provide a measure of cell stability, write margin, and read margin. In addition, as will now be described, similar procedures may be used in performing margin tests in the manufacturing context, either in providing additional assurance of the continued robust performance of the memories, or in providing analysis of test yield loss. It is contemplated that these manufacturing tests may be performed on memories in wafer form, after packaging, or both, and that these tests are applicable both to stand-alone memory integrated circuits and also embedded memories within larger scale integrated circuits.

Figure 8A:
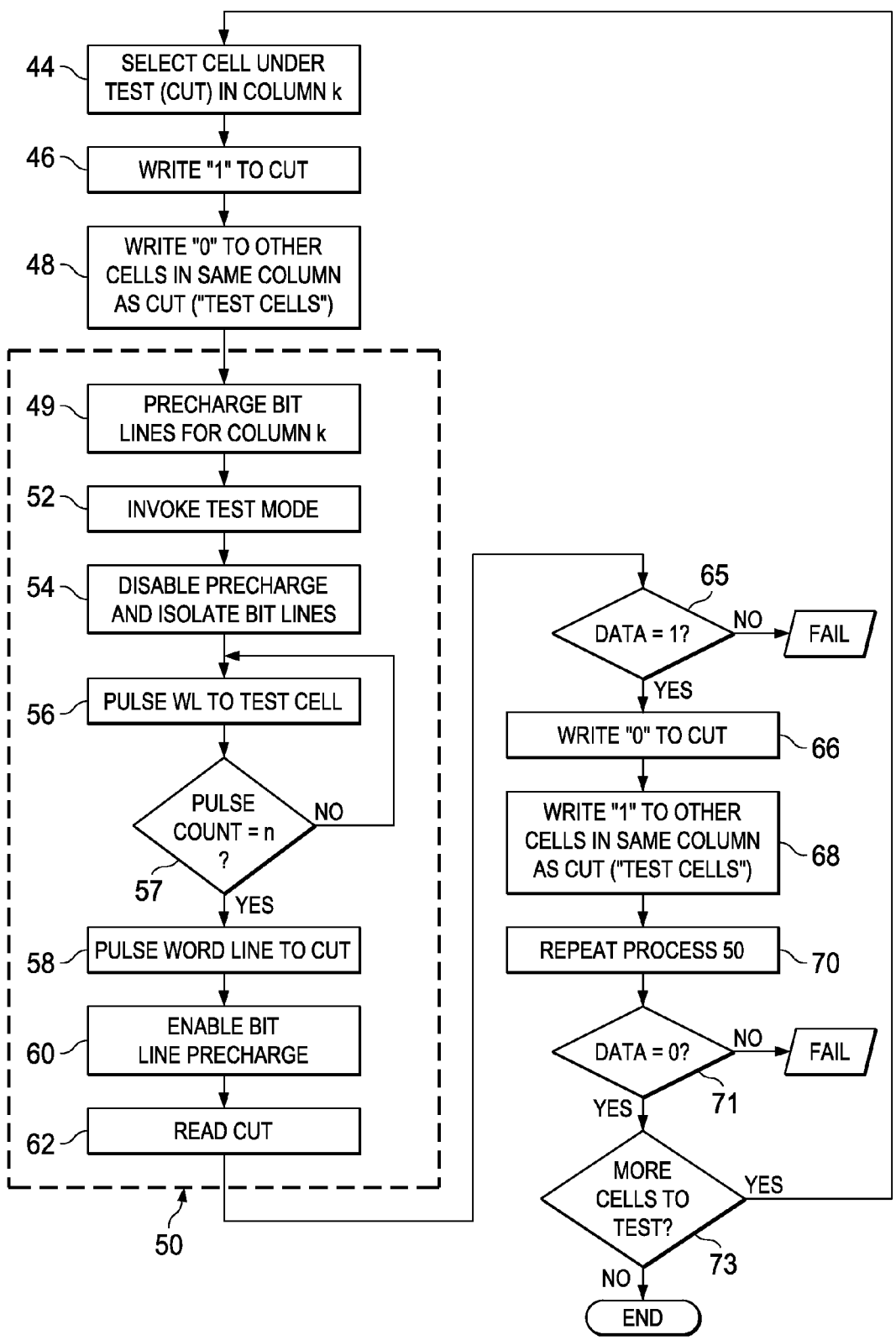
FIG. 8a is a flow diagram illustrating the operation of a cell stability manufacturing test according to embodiments of the invention.

Referring now to FIG. 8a, the operation of RAM 28 in carrying out a cell stability, or static noise margin, manufacturing test according to embodiments of this invention will now be described, with reference to the example of FIGS. 3a and 4 as appropriate. The cell stability test of this embodiment of the invention begins with process 44, in which a memory cell 40 to be tested (i.e., the cell under test, or "CUT") in a column k of RAM 28 is selected by the automated test equipment, or other external controlling source, or by processor 22 (for the context of embedded RAM 28), applying a memory address to RAM 28. It is contemplated that, in most cases, the cell stability manufacturing test of this embodiment of the invention (as well as the write margin and read margin manufacturing tests described below) are column-based tests, in that the operations in one column do not affect cells in other columns. As such, process 44 may select a CUT in more than one column of memory array 30, to reduce test time. In those memory architectures in which multiple columns share a single read/write circuit 34 (e.g., as shown in FIG. 3b), a maximum of one column per sense amplifier (i.e., read/write circuit 34') may be tested at a time. Conversely, in the case of a memory architecture in which an instance of sense amplifier $34SA_k$ is provided for each column k, a CUT in each and every column of memory array 30 may be selected in this process 44. If a cell in more than one column is tested, it is most efficient if the CUTs are in the same row. For purposes of clarity, this embodiment of the invention will be described in connection with a single CUT in a single column; those skilled in the art having reference to this specification will thus recognize that the same process can be applied simultaneously to CUTs in more than one column.

In process 46, the CUT selected in process 44 is written with the data state "1", using a conventional data write cycle. In process 48, other cells 40 in the same column k (but, of course, different rows) as the CUT selected in process 44 are written with "0" data states, also using conventional data write cycles. This process 48 may write the "0" data state to each and every other cell 40 in the same column k as the CUT, or may write the "0" to a subset of other such cells 40 in that column k. These cells 40 in the same column k, other than the CUT, will be referred to as "test cells". The result of processes 46 and 48, in this embodiment of the invention, corresponds to the state of memory cells 40 in column k described above relative to FIG. 5c, but with opposite data states from that shown.

Once the data states in cells $40_{CUT}$, $40_{TST}$ are established by processes 46, 48, bit lines $BLT_k$, $BLB_k$ are precharged to a high voltage (e.g., power supply voltage $V_{dda}$) by precharge circuitry 31, in preparation for a normal mode cycle. In process 52, however, test mode is invoked by automated test equipment or another external control source applying the appropriate test mode enable signals or instruction codes to test logic 35 (FIG. 3a). After test mode is invoked in process 52, test logic 35 executes process 54 by issuing a control signal on line FLT to precharge circuitry 31 so that bit lines $BLT_k$, $BLB_k$ of column k under test are allowed to float, in isolation from being driven or pulled to any particular voltage. Bit lines $BLT_k$, $BLB_k$ are isolated from read/write circuits 34 at this time, for example by holding transfer gates $43_k$ off by the appropriate control logic. In the arrangement of FIG. 3b, in which multiple pairs of columns are multiplexed to a single sense amplifier, isolation of bit lines $BLT_k$, $BLB_k$ can be easily performed by applying a column address of one of the other columns in each group, thus causing each 4:1 column select circuit 32' to select a column other than that containing the current cell under test $40_{CUT}$ and test cells $40_{TST}$. Following process 54 in this test mode, bit lines $BLT_k$, $BLB_k$ remain at the high precharge voltage (e.g., $V_{dda}$).

In process 56, row decoder 33 energizes one of the word lines WL[m−1:0] associated with one of test cells $40_{TST}$ for a relatively brief pulse, as compared with a full read or write cycle in normal operation. As shown in FIG. 3a, test logic 35 or other circuitry in RAM 28 issues a control signal on line PLS to row decoder in this test mode, indicating that the duration of word line pulses is to be shortened from that in normal operation. For example, it is contemplated that a 300 psec word line pulse is issued in process 56 to the selected word line WL[j], as compared with a 1.2 nsec duration of an energized word line in normal read or write operation. As described above, this word line pulse will briefly connect the storage nodes SNT, SNB of test cell $40_{TST}$ in column k to bit lines $BLT_k$, $BLB_k$, respectively, and in this case will discharge bit line $BLT_k$ by voltage dV (e.g., similarly as shown in FIG. 5d).

According to this embodiment of the invention, process 56 is repeated n times to discharge the voltage at bit line $BLT_k$ sufficiently to perform the desired stability test of CUT cell $40_{CUT}$. The extent of this discharging depends on the number of repetitions of process 56, and on the duration of the shortened word line pulse in each repetition. As such, it is contemplated that design of row decoder 33 for operation in this test mode will determine the duration of these shortened word line pulses, such that the eventual discharged bit line voltage can be controlled by the number of test cell accesses (i.e., the number of repetitions of process 56). Alternatively, circuitry may be provided in connection with row decoder 33 to adjust or set the word line pulse duration in this special test mode. In any case, referring back to FIG. 8a, therefore, decision 57 is executed to determine whether the desired number n of repetitions of process 56 have been completed for cell $40_{CUT}$ in column k. If not (decision 57 returns a "no" result), then process 56 is repeated.

According to embodiments of this invention, it is contemplated that the particular row of test cells $40_{CUT}$ selected in each instance of process 56 will be determined by automated test equipment or another external source applying a row address value to RAM 28, in the conventional manner for normal read or write cycles. As such, it is contemplated that the automated test equipment or other external source will sequence through the row addresses of test cells $40_{TST}$ as process 56 is repeated n times in this embodiment of the invention. By accessing different test cells $40_{TST}$ in different rows of memory array 30 in the repeated instances of process 56, according to an embodiment of the invention, cell-to-cell variations in storage node voltages, cell driver devices, and the like will average out, thus resulting in repeatable test conditions. Alternatively, the same test cell or cells $40_{TST}$ may be repeatedly accessed in the n repetitions of process 56 if desired, especially if the number of rows in memory array 30 is relatively small. In any case, embodiments of this invention pulse only one word line at a time in process 56, which maintains the power dissipation at a minimum and which allows row decoder 33 to be constructed as appropriate for its normal operation, rather than requiring additional drive current and larger (stronger) power lines, as would be necessary to drive the n word lines simultaneously. In addition, it is believed that the current required to simultaneously drive multiple word lines, as in the conventional test approach, causes sufficiently severe I-R voltage drop that the voltage actually applied to the word lines will be degraded from the normal full word line voltage, causing poor coupling of the selected cells to their respective bit lines.

In this cell stability test, the voltage to which bit line $BLT_k$ is discharged corresponds to the static noise margin to be tested. The voltage on bit line $BLT_k$ directly affects the voltage on storage node SNT (see FIG. 1a). Referring back to FIG. 1b, the voltage VTEST corresponds to a voltage on bit line $BLT_k$ that can distinguish a strong cell with metastable voltage $VX_{STR}$ from a weak cell with metastable voltage $VX_{WK}$. As such, the bit line voltage corresponding to the storage node voltage VTEST would be a useful voltage for the discharged bit line $BLT_k$. Of course, such factors as the extent to which cell instability or poor static noise margin can be tolerated, variations among test equipment, expected variations in process parameters of RAM 28, temperature "guardbanding", and the like also enter into the selection of the test voltage. In any case, it is contemplated that the desired test voltage, and thus the number n of repetitions of process 56 as well as the duration of the shortened word line pulse in each instance of process 56, can be determined by way of characterization. The stability characterization procedure described above in connection with FIGS. 5a and 5b can of course be used to arrive at the desired pulse count n for this manufacturing margin screen.

Once bit line $BLT_k$ in this example is discharged by way of the n instances of process 56, process 58 is then performed by row decoder 33 energizing the word line for the row containing cell under test $40_{CUT}$ (e.g., word line WL[j] of FIG. 5b). This process 58 is performed while precharge circuitry 31 remains disabled, with bit lines $BLT_k$, $BLB_k$ floating. The duration of this energizing of word line WL[j] to cell $40_{CUT}$ is contemplated to be essentially on the order of a normal write cycle word line cycle. This selection of a longer word line pulse, in the special test mode, may be made by automated test equipment or another external source, for example by asserting a write enable control signal while RAM 28 is in the test mode; that selection may be communicated by test logic 35 to indicate to row decoder 33. Alternatively, word line WL[j] may be asserted, in process 58, for the same shortened duration as in each instance of process 56. In any case, the row address of the current cell under test $40_{CUT}$ will be asserted by automated test equipment or the other external source, as the case may be, to select the appropriate word line WL[j]. The effect of process 58 is to apply the discharged bit line voltage to storage node SNT in cell under test $40_{CUT}$, to determine whether this voltage is sufficient to change the state of cell under test $40_{CUT}$, which is currently at a "1" level as shown in FIG. 5c. In effect, process 58 attempts a "write" using this discharged bit line $BLT_k$ voltage. As mentioned above, because bit line $BLB_k$ is not discharged to any substantial degree by the repeated word line pulses, the stability of cell under test $40_{CUT}$ can be precisely evaluated.

After the attempted "write" of process 58, bit line precharge is again enabled by precharge circuitry 31, in process 60, for example by de-asserting the test mode at test logic 35. In process 62, the state of cell under test $40_{CUT}$ is read by way of a normal read operation, to determine whether the state of cell under test $40_{CUT}$ has changed as a result of the n instances of process 56 and the "write" of process 58. The data state read in process 62 is then compared against the original "1" data state originally written to cell under test $40_{CUT}$ in process 46, in decision 65.

If the read of process 62 returns a "0" result (decision 65 is "no"), then the discharged voltage on bit line $BLT_k$ caused cell under test $40_{CUT}$ to change its state, indicating that cell under test $40_{CUT}$ did not tolerate the tested margin. The automated test equipment or other external controller will issue a corresponding indication. The test process of FIG. 5a may then be terminated, may continue to another test, or continue in some other way as indicated by the test program.

On the other hand, if the original "1" state remains (decision 65 is "yes"), cell under test $40_{CUT}$ tolerated the tested cell stability margin. Cell under test $40_{CUT}$ is then tested in the same manner for the opposite data state, beginning with process 66, in which it is written with a "0" state. In process 68, other cells 40 in the same column k are written with the opposite "1" data state, to serve as test cells $40_{TST}$. Discharge process 50, constituted by entry into test mode, floating bit lines $BLT_k$, $BLB_k$, word line pulsing, and read of cell under test $40_{CUT}$, as described above in connection with processes 49 through 62, is then repeated for this opposite data state, in process 70. For this data state, it is bit line $BLB_k$ that is discharged from its precharged voltage, and thus it is storage node SNB of cell under test $40_{CUT}$ that is disturbed by this discharged voltage.

Following process 70, the read data state of cell under test $40_{CUT}$ is then compared with the "0" data state written in process 66. If cell under test $40_{CUT}$ is now a "1" (decision 71 is "no"), then the tested read stability margin was not met, and the sequence terminates or continues accordingly. If cell under test $40_{CUT}$ retains its "0" state (decision 71 is "yes"), then decision 73 is executed to determine whether any cells 40 remain to be tested in RAM 28. If so (decision 73 is "yes"), then control passes back to process 44 to select the next cell under test, and the stability test is repeated. On the other hand, if the last cell 40 to be tested has been tested, the cell stability test of this embodiment of the invention is complete.

As evident from this description, the stability of cells 40 in RAM 28 can be readily tested according to embodiments of this invention. This cell stability, or static noise margin, test capability allows precise setting of the desired margin, by controlling the number of repetitions of test cell access for each cell. This cell stability test can be performed using conventional automated test equipment, for memories either or both in wafer form and also after packaging, and for standalone memories as well as embedded RAM. In addition, the instantaneous power consumed by the stability test is kept to a minimum, allowing the circuitry to be designed for the power consumed in normal operation rather than for higher levels of power used only in test.

According to embodiments of this invention, RAM 28 can be similarly tested for write margin as a manufacturing screen, as will now be described according to FIG. 8b. In this embodiment of the invention, many of the steps in this write margin test process are identical to those described above for the cell stability test, and as such are referred to by the same reference numerals in FIG. 8b as in FIG. 8a. And as described above, the write margin test of this embodiment of the invention can be readily executed under the control of automated test equipment, an external controller, or by way of an internal self-test by processor 22 (for the context of embedded RAM 28).

Figure 8B:
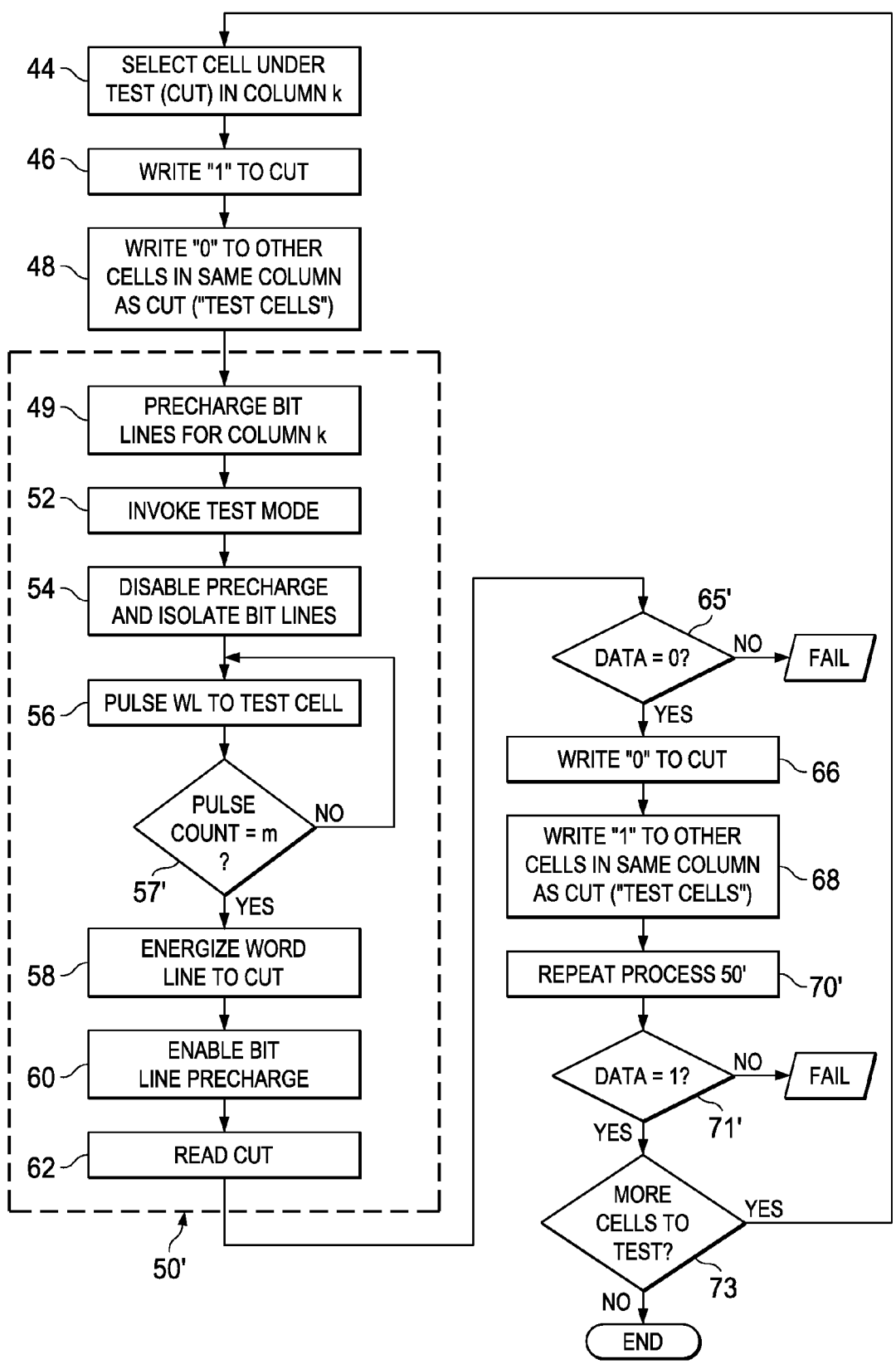
FIG. 8b is a flow diagram illustrating the operation of a write margin manufacturing test according to embodiments of the invention.

As shown in FIG. 8b, the write margin test begins with the selection of a cell under test in process 44, and the writing of a "1" state to cell under test $40_{CUT}$ in process 46. In process 48, a "0" state is written to test cells $40_{TST}$, which are cells in the same column k as cell under test $40_{CUT}$. Disturb process 50' is now performed, beginning with the precharge of bit lines $BLT_k$, $BLB_k$ of column k in process 49, followed by floating these bit lines $BLT_k$, $BLB_k$ by invoking test mode (process 52) and disabling precharge circuitry 31 and thus isolating bit lines $BLT_k$, $BLB_k$ (process 54).

Shortened word line pulses are now issued to test cells $40_{TST}$ in column k by way of repeated instances of process 56. In performing this write margin manufacturing margin screen, however, the number m of repetitions of process 56 will be greater than the number n instances performed in carrying out a cell stability test as described above. The number m of repetitions of process 56 may be determined by way of characterization; the characterization procedure described above in connection with FIGS. 6a and 6b will, of course, be well-suited for determining this value m. The eventual voltage to which bit line $BLT_k$ is discharged by the m repetitions of process 56 will be above the usual write voltage (e.g., $V_{ssa}$), considering that RAM 28 has presumably already been tested for functionality under nominal conditions. In short, it is the "margin" above the normal bit line write voltage that is being tested by this write margin test, to determine the noise that can be tolerated by cell under test $40_{CUT}$ during a write operation. As in the case of the cell stability test, bit line $BLB_k$ is not discharged to any substantial degree by the repeated word line pulses, because storage node SNB in each test cell $40_{TST}$ is at a "1" level. Because bit line $BLB_k$ remains at or near its precharge voltage, the write margin of cell under test $40_{CUT}$ can be more precisely evaluated according to this embodiment of the invention.

Upon decision 57' determining that the desired number m of repetitions of process 56 is complete (decision 57' is "yes"), row decoder 33 energizes the word line WL[j] associated with cell under test $40_{CUT}$, in process 58, to perform a write operation. Of course, in this write margin test, the write operation of process 58 is performed without precharge of bit lines $BLT_k$, $BLB_k$, and of course without using write circuitry $34WR_k$; rather, the discharged voltage at bit line $BLT_k$ is applied to storage node SNT of cell under test $40_{CUT}$, in this example, to test whether that voltage is sufficient to change the stored state. It is useful that the duration of the energizing of word line WL[j] in process 58 correspond to that of a normal mode write cycle. Following write process 58, normal mode is then again invoked, bit lines $BLT_k$, $BLB_k$ are precharged to their normal high voltage in process 60, and cell under test $40_{CUT}$ is read in process 62.

Decision 65' determines whether the data state read in process 62 indicates that cell under test $40_{CUT}$ changed states as a result of the write of process 58. If not (decision 65' is "no"), this cell changed state at this tested write margin; the appropriate indication is issued, and the test sequence is terminated or other action is taken as desired. If cell under test $40_{CUT}$ changed states as a result of process 50' and its write process 58, then it satisfied the tested write margin for this data state. Beginning in process 66, cell under test is then tested for its opposite data state, beginning with a conventional write of a "0" data state in process 66, writing of "1" data states to test cells $40_{TST}$ in process 68, and repeating of process 50' by discharge of bit line $BLB_k$, writing of cell under test $40_{CUT}$, and reading of that cell, in process 70'. If the data state is not successfully written to a "1" data state in process 70' (decision 71' is "no"), the cell did not meet the tested write margin and the appropriate action is taken. If cell under test $40_{CUT}$ is successfully written to the "1" data state (decision 71' is "yes"), decision 73 is then performed to determine whether additional cells are to be tested, and if so passes control back to process 44 for selection of the next cell to be tested. A "no" result for decision 73 indicates completion of the write margin test for all cells 40 of RAM 28.

According to this embodiment of the invention, therefore, write margin testing can be performed using the same circuitry as used in performing the cell stability test, differing only in the number of repetitions of word line pulses to the test cells, and in the pass/fail criteria. It is contemplated, of course, that the specific conditions under which the cell stability and write margin tests are performed may also differ. In any case, it is contemplated that the write margin test of FIG. 8b can be readily performed by automated test equipment, on memories either or both in wafer form or after packaging, and on both stand-alone memory devices as well as embedded RAM.

Figure 8C:
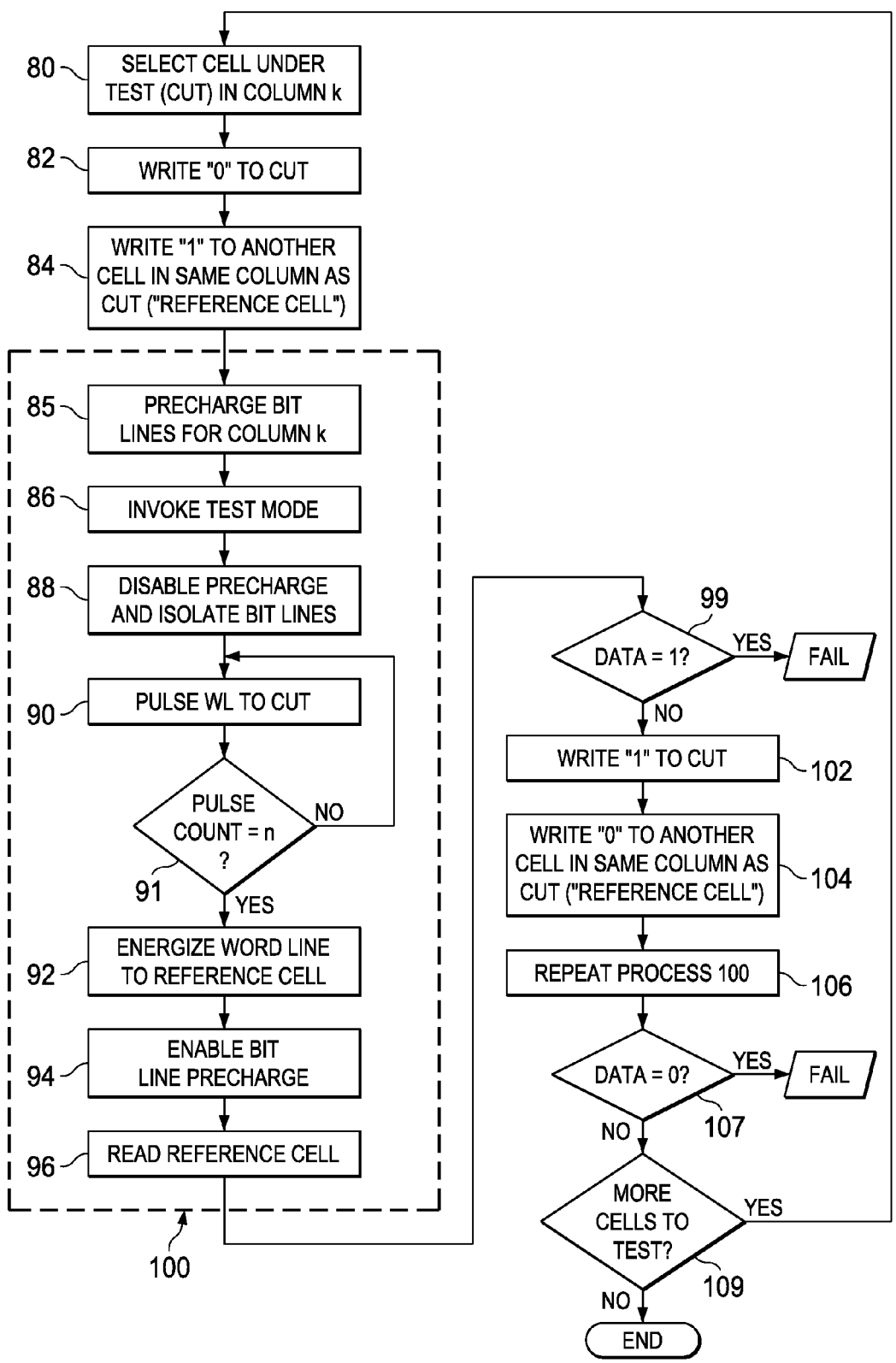
FIG. 8c is a flow diagram illustrating the operation of a read margin manufacturing test according to embodiments of the invention.

RAM 28 according to embodiments of this invention is also well-suited for the performing of a read current margin test, as will now be described in connection with FIG. 8c. As known in the art, the read current margin of an SRAM cell refers to the read current that can be drawn by its n-channel driver transistor connected to the "0" level storage node in a read operation, in pulling down its precharged bit line when selected for a read. Strong read current drive of this transistor serves to develop a strong differential bit line voltage in the read cycle, and thus adequate margin against noise coupling to the bit lines or sense amplifier.

As in the case of the cell stability and write margin screen tests described above, it is contemplated that this read margin test can be readily executed under the control of automated test equipment or another controller external to RAM 28, or even by way of an internal self-test by processor 22 (for the context of embedded RAM 28). And also, as in the case of the read stability and write margin tests, a single SRAM cell in RAM 28 may be tested at a time, or multiple cells may be simultaneously tested (up to one per column, depending on the architecture), as it is contemplated that the mechanisms involved in the read margin test operate independently from column to column.

The read current margin, or simply read margin, test according to embodiments of this invention begins with process 80 in which a cell in RAM 28 to be tested is selected. In process 82, cell under test $40_{CUT}$ in column k is written with a "0" data state, by way of a normal mode write cycle. And in process 84, another cell 40 in the same column k is written with the opposite, "1", data state by way of a normal mode write cycle, and becomes reference cell $40_{REF}$ for purposes of this test. In this read margin test, only one reference cell $40_{REF}$ is required; the particular data states stored in other cells 40 of column k are not important.

In process 86, the test mode is invoked by way of communicating the appropriate test mode signal to test logic 35, which issues a control signal on line FLT to precharge circuitry 31. In response, precharge of bit lines $BLT_k$, $BLB_k$ is inhibited, and these bit lines $BLT_k$, $BLB_k$ are allowed to float at their previously precharged high voltage. Process 90 is then performed, by way of which word line WL[j] for the row associated with cell under test $40_{CUT}$ is pulsed, preferably for a shortened duration relative to a normal read operation as invoked in the manner described above in connection with the cell stability and write margin tests. This pulse of word line WL[j] connects storage nodes SNT, SNB of cell under test $40_{CUT}$ to bit lines $BLT_k$, $BLB_k$, respectively. During each pulse of its word line WL[j], storage node SNT of cell under test $40_{CUT}$ is connected to bit line $BLT_k$, thus discharging bit line $BLT_k$ by an incremental voltage dV. This word line pulse applied in process 90 is performed a number n times, by way of decision 91 determining whether the number n of repetitions of process 90 have been completed. Of course, the number n of repetitions for this read margin test will likely be different than the number of repetitions in the cell stability or read margin tests, and will be developed by way of characterization and the like. For example, the characterization procedure described above in connection with FIGS. 7a through 7c will be useful in determining this number n.

Upon the number n of repetitions of process 90 being complete (decision 91 is "yes"), the word line for the row containing reference cell $40_{CUT}$ is energized in process 92, connecting bit lines $BLT_k$, $BLB_k$ to storage nodes SNT, SNB of reference cell $40_{REF}$. More particularly, for this data state, process 92 applies the bit line $BLT_k$ voltage, as discharged by the n pulses of word line WL[j] connecting the "0" level at storage node SNT of cell under test $40_{CUT}$, to storage node SNT of reference cell $40_{REF}$. The duration of the energizing of the word line in process 92 may be longer than the pulses of process 90, for example of the same duration as the word line is energized in a normal write cycle, after which the word line returns inactive low again, and the state of reference cell $40_{REF}$ is latched and retained.

In process 94, the test mode is exited, and bit lines $BLT_k$, $BLB_k$ are precharged to their normal high voltage. And in process 96, the data state of reference cell $40_{REF}$ is read in a normal read cycle. The state of reference cell $40_{REF}$ as read in process 96 provides an indication of the strength of the read current of cell under test $40_{CUT}$. If cell under test $40_{CUT}$ drives a strong read current, the n pulses of its word line in process 90 will have pulled bit line $BLT_k$ sufficiently low that the energizing of the word line to reference cell $40_{REF}$ in process 94 causes reference cell $40_{REF}$ to change its state from its previous "1" state (at storage node SNT) to a "0" state. Conversely, if the read current drawn by cell under test $40_{CUT}$ is relatively weak, the voltage at bit line $BLT_k$ after the n repetitions of process 90 will not be sufficiently low, and the state of reference cell $40_{CUT}$ will not change in process 92. The number n of repetitions of process 90 may be determined by way of characterization, for example by testing many cells 40 of many memory devices in this manner, incrementing the number n of repetitions to fail, and analyzing the distribution of results.

Decision 99 thus determines whether the data state read from reference cell $40_{REF}$ is still at a "1" level. If so (decision 99 is "yes"), cell under test $40_{CUT}$ did not meet the tested read margin, an appropriate indication is issued, and the test sequence is terminated or otherwise managed accordingly. If reference cell $40_{REF}$ is now at a "0" state (decision 99 is "no"), cell under test $40_{CUT}$ satisfied the tested read margin level for the "0" data state. The test is now repeated, for cell under test $40_{CUT}$, for the "1" data state, beginning with process 102 in which the "1" data state is written to cell under test $40_{CUT}$. In process 104, reference cell $40_{REF}$ in the same column k is written with the opposite "0" data state. Process 100, including the floating of bit lines $BLT_k$, $BLB_k$, the repetitive pulsing of the word line to cell under test $40_{CUT}$, the energizing of the word line to reference cell $40_{REF}$, and the reading of reference cell $40_{REF}$, is repeated in process 106. Decision 107 determines whether cell under test $40_{CUT}$ has caused reference cell $40_{CUT}$ to change state; if not (decision 107 is "yes"), the read margin level tested was not met and the test sequence is terminated or otherwise managed. If the read current of cell under test $40_{CUT}$ was sufficient to change the state of reference cell $40_{REF}$ (decision 107 is "no"), then decision 109 is executed to determine whether additional cells 40 in RAM 28 remain to be tested for read margin. If so (decision 109 is "yes"), control passes back to process 80 in which the next cell under test is selected. If not (decision 109 is "no"), the test is complete.

It is useful, in this read current margin test, to ensure that the reference cell $40_{REF}$ used in the evaluation of the read current of cell under test $40_{CUT}$ is not itself unbalanced. In other words, it is useful to ensure that reference cell $40_{REF}$ has adequate cell stability (i.e., does not change state too easily, in either direction) and has good write margin (i.e., is not too difficult to change state, in either direction). For example, reference cell $40_{REF}$ may be selected from those cells that have passed the cell stability and write margin tests described above in connection with FIGS. 5a and 6a, respectively.

According to this embodiment of the invention, the read current margin of cells 40 in RAM 28 can be readily tested. The specific margin used in the test can be precisely set by controlling the number of repetitions of the word line pulse, for a given duration. This read current margin test can be performed using conventional automated test equipment, for memories either or both in wafer form and also after packaging, and for stand-alone memories as well as for embedded RAM (which may be testable either by external equipment or by its own embedded processor). In addition, the instantaneous power consumed by the stability test is kept to a minimum, allowing the circuitry to be designed for the power consumed in normal operation rather than for higher levels of power used only in test.

Embodiments of this invention are also useful in analyzing the cause of a failure of a RAM to meet its desired specifications, as determined in the context of a manufacturing test environment. As known in the art, many complex and large-scale integrated circuits, such as stand-alone memories and large-scale logic devices including embedded memories, are tested functionally at least one time during their manufacture. These functional tests are generally performed at worst case "corners" of bias voltage and timing constraints, to ensure that the tested integrated circuit meets its full specification range. Testing at easier "nominal" conditions is generally omitted, to reduce test time.

According to another aspect of this invention, the margin characterization procedures described above can be used to identify the cause of a functional failure. For example, if a memory can be written to and read under at least one bias and timing conditions, but fails to accurately read or write data under other bias or timing conditions, one can conclude that the cause of the failure is not an open or short circuit within the structure of the memory. Instead, the failure may be a cell stability failure, a write margin failure, or a read margin failure, or a failure due to other mechanisms. Generally, a failure due to any one of mechanisms of cell instability, failed write, or failed read, will often be manifest in the same way as if it had failed because of one of the other three mechanisms. One cannot often determine the failure mechanism from the failed manufacturing test itself. According to this aspect of the invention, the characterization procedures described above in connection with FIGS. 5a, 6a, and 7a may assist in the diagnosis of such a functional failure, thus providing insight into the cause of the marginality.

Figure 9:
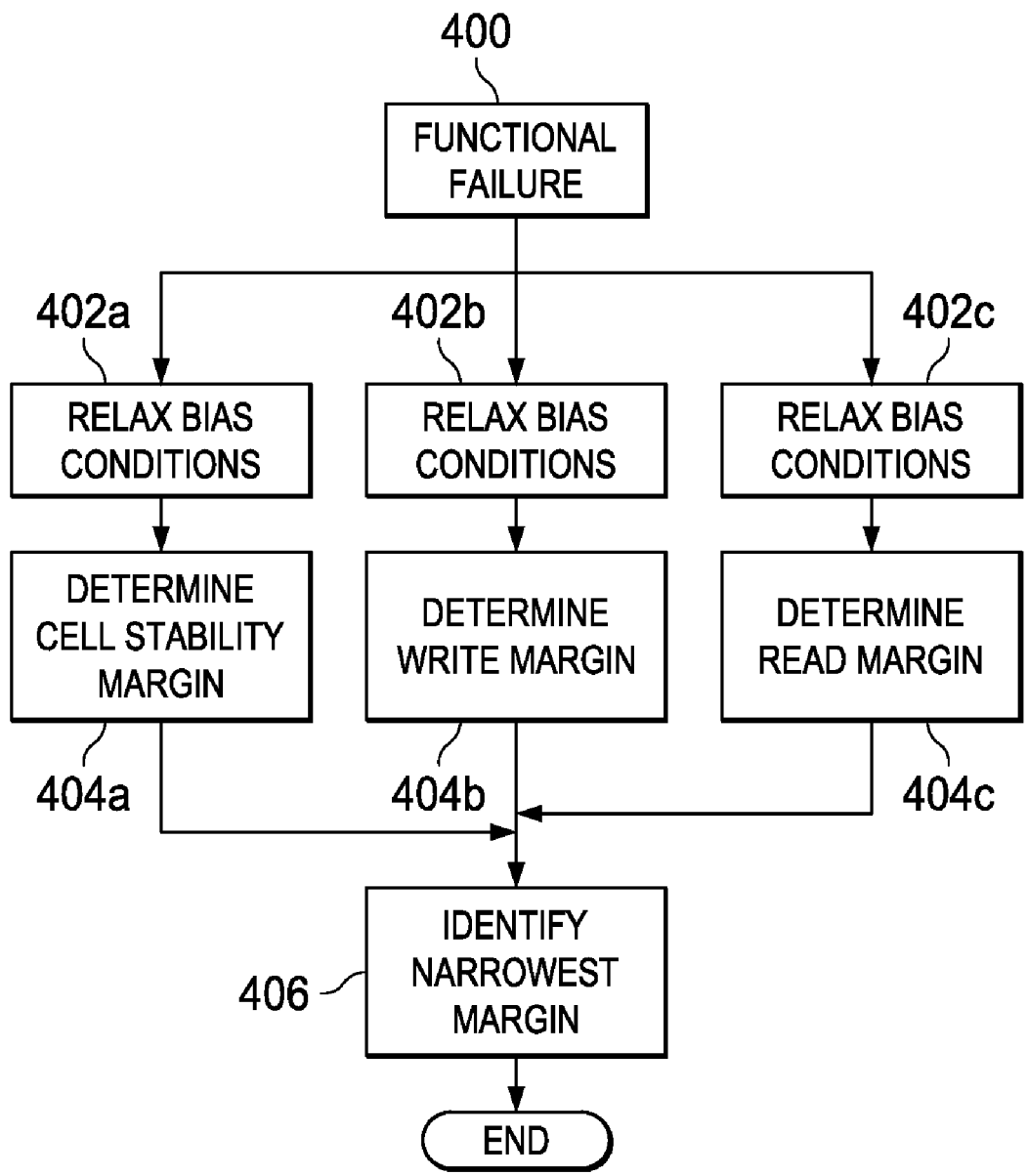
FIG. 9 is a flow diagram illustrating a failure analysis method according to an embodiment of the invention.

FIG. 9 illustrates a generalized flow chart of the diagnosis procedure according to an embodiment of the invention. In process 400, the automated test equipment or other function managing the test process indicates that a particular sample of RAM 28 has failed a functional test. It is presumed, for purposes of this description, that this sample of RAM 28 is functional under some condition, such that the failure noted in process 400 relates to marginal operation in one way or another.

According to this embodiment of the invention, the three margins of cell stability, write margin, and read margin are characterized for the failed device. This characterization is performed at relaxed bias conditions for each particular margin. For example, in process 402a, bias conditions are applied to RAM 28 that are somewhat relaxed from the worst case condition for cell stability (e.g., at a higher than minimum $V_{dda}$ power supply voltage). In process 404a, the cell stability for RAM 28 is then determined at these relaxed bias conditions, for example by way of the stability characterization procedure described above in connection with FIG. 5a. Similarly, in process 402b, the bias conditions are relaxed from the standpoint of write margin. The characterization of the write margin for this RAM 28 is then performed at these bias conditions in process 404b, for example according to the write margin characterization procedure described above in connection with FIG. 6a. In process 402c, the bias conditions are relaxed in the context of read margin, followed by characterization of the read margin of RAM 28 at these relaxed conditions in process 404c, for example according to the characterization procedure described above in connection with FIG. 7a. Of course, the order in which these characterization procedures 404a, 404b, 404c are performed relative to one another is not important, as indicated by FIG. 9.

Following completion of procedures 404a, 404b, 404c, the narrowest (i.e., the worst) margin evaluated by these three characterizations is then identified in process 406. It is contemplated that, in general, one of the three margins (stability, write margin, read margin) will be noticeably worse at the relaxed bias conditions than the other two margins. Upon identifying this narrowest margin, and the mechanism corresponding to that margin, a likely cause of the functional failure noted in process 400 is identified.

According to the embodiments of this invention, methods of easily characterizing, screening, and performing failure analysis of the common failure mechanisms of cell stability, write margin, and read margin in modern static RAM devices are provided. These mechanisms are tested in a very direct manner, by way of setting a bit line voltage and disturbing memory cells accordingly; however, according to this embodiment of the invention, access to the bit lines is attained efficiently, and without increasing the instantaneous power consumption, and corresponding drive circuitry required, from that otherwise necessary for normal operation.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed.

What is claimed is:

1. A method of evaluating an operating margin in a memory, the memory comprising a plurality of memory cells, arranged in rows and columns, the memory cells in each column associated with a pair of complementary bit lines, the memory cells in each row associated with a word line, each memory cell comprised of cross-coupled inverters defining a pair of storage nodes, and a pair of pass transistors for coupling the storage nodes to the bit lines of its column responsive to an active level on its associated word line;

wherein the method comprises:
writing opposite data states to a first memory cell and at least one memory cell other than the first memory cell in a selected column;
then precharging the bit lines of the selected column to a precharge voltage;
then floating the bit lines of the selected column;
during the floating step, driving a plurality of pulses of an active level to a word line associated with one of the at least one other memory cells;

after the driving step and during the floating step, driving the word line associated with the first memory cell to an active level;
then precharging the bit lines of the selected column; and
then reading the state of the first memory cell.

2. The method of claim 1, wherein each of the writing and reading steps drives the word line associated with a selected memory cell to an active level for at least a first duration;
and wherein the plurality of pulses each have a second duration that is shorter than the first duration.

3. The method of claim 1, wherein the driving step drives the word line associated with the first memory cell to an active level for at least the first duration.

4. The method of claim 1, wherein the operating margin being tested is a cell stability margin of the first memory cell;
wherein the writing step writes a first data state into the first memory cell and a second data state into the at least one other memory cell.

5. The method of claim 4, further comprising:
prior to the driving step, selecting a pulse count value indicating the number of pulses to be driven in the driving step;
responsive to the reading step reading the first data state from the first memory cell:
increasing the pulse count value; and
then repeating the writing, precharging, floating, driving, precharging, and reading steps; and
responsive to the reading step reading the second data state from the first memory cell:
decreasing the pulse count value; and
then repeating the writing, precharging, floating, driving, precharging, and reading steps.

6. The method of claim 4, further comprising:
issuing a fail indication responsive to the reading step reading the second data state from the first memory cell.

7. The method of claim 4, wherein the driving step comprises:
sequentially driving a pulse on the word line associated with each of a plurality of the at least one other memory cells.

8. The method of claim 1, wherein the operating margin being tested is a write margin of the first memory cell;
wherein the writing step writes a first data state into the first memory cell and a second data state into the at least one other memory cell.

9. The method of claim 8, further comprising:
prior to the driving step, selecting a pulse count value indicating the number of pulses to be driven in the driving step;
responsive to the reading step reading the first data state from the first memory cell:
increasing the pulse count value; and
then repeating the writing, precharging, floating, driving, precharging, and reading steps; and
responsive to the reading step reading the second data state from the first memory cell:
decreasing the pulse count value; and
then repeating the writing, precharging, floating, driving, precharging, and reading steps.

10. The method of claim 8, further comprising:
issuing a fail indication responsive to the reading step reading the first data state from the first memory cell.

11. The method of claim 8, wherein the driving step comprises:
sequentially driving a pulse on the word line associated with each of a plurality of the at least one other memory cells.

12. The method of claim 1, wherein the at least one other memory cell is a single memory cell;
wherein the operating margin being tested is a read margin of the single other memory cell;
and wherein the writing step writes a first data state into the first memory cell and a second data state into the single other memory cell.

13. The method of claim 12, further comprising:
prior to the driving step, selecting a pulse count value indicating the number of pulses to be driven in the driving step;
responsive to the reading step reading the second data state from the first memory cell:
decreasing the pulse count value; and
then repeating the writing, precharging, floating, driving, precharging, and reading steps; and
responsive to the reading step reading the first data state from the first memory cell:
increasing the pulse count value; and
then repeating the writing, precharging, floating, driving, precharging, and reading steps.

14. The method of claim 12, further comprising:
issuing a fail indication responsive to the reading step reading the first data state from the first memory cell.

15. The method of claim 1, wherein the memory further comprises a plurality of sense amplifiers coupled to associated ones of the complementary bit lines;
and further comprising:
during the floating step, isolating the complementary bit lines from its associated sense amplifier.

16. The method of claim 15, wherein the writing and reading steps each comprise addressing the selected column;
wherein each of the sense amplifiers is associated with a group of columns, such that in a read operation, a single one of the columns in its group is coupled to the sense amplifier according to an address value;
and wherein the isolating step comprises:
addressing a column, other than the selected column, in the group of columns containing the selected column.

17. A method of diagnosing a functional failure in a memory that has failed a functional test, the memory comprising a plurality of memory cells, arranged in rows and columns, the memory cells in each column associated with a pair of complementary bit lines, the memory cells in each row associated with a word line, each memory cell comprised of cross-coupled inverters defining a pair of storage nodes, and a pair of pass transistors for coupling the storage nodes to the bit lines of its column responsive to an active level on its associated word line, the method comprising the steps of:
biasing the identified memory to a relaxed voltage as compared to the failed functional test;
evaluating a cell stability margin of a first memory cell in the memory by performing a plurality of operations comprising:
writing a first data state to the first memory cell and a second data state into at least one memory cell other than the first memory cell in a selected column;
then precharging the bit lines of the selected column to a precharge voltage;
then floating the bit lines of the selected column;
selecting a pulse count;
during the floating step, driving a number of pulses of an active level to a word line associated with one of the at least one other memory cells, the number of pulses corresponding to the pulse count;
after the driving step and during the floating step, driving the word line associated with the first memory cell to an active level;
then precharging the bit lines of the selected column;
then reading the state of the first memory cell;
responsive to the reading step reading the first data state from the first memory cell:
increasing the pulse count; and
then repeating the writing, precharging, floating, driving, precharging, and reading steps;
responsive to the reading step reading the second data state from the first memory cell:
decreasing the pulse count; and
then repeating the writing, precharging, floating, driving, precharging, and reading steps; and
identifying the cell stability margin corresponding to a pulse count value causing the first memory cell to change to the second data state;
evaluating a write margin of the first memory cell in the memory by performing a plurality of operations comprising:
writing a first data state to the first memory cell and a second data state into at least one memory cell other than the first memory cell in the selected column;
then precharging the bit lines of the selected column to a precharge voltage;
then floating the bit lines of the selected column;
selecting a pulse count;
during the floating step, driving a number of pulses of an active level to a word line associated with one of the at least one other memory cells, the number of pulses corresponding to the pulse count;
after the driving step and during the floating step, driving the word line associated with the first memory cell to an active level;
then precharging the bit lines of the selected column;
then reading the state of the first memory cell;
responsive to the reading step reading the first data state from the first memory cell:
increasing the pulse count; and
then repeating the writing, precharging, floating, driving, precharging, and reading steps;
responsive to the reading step reading the second data state from the first memory cell:
decreasing the pulse count; and
then repeating the writing, precharging, floating, driving, precharging, and reading steps; and
identifying the write margin corresponding to a pulse count value causing the first memory cell to change to the second data state; and
evaluating a read margin of the first memory cell in the memory by performing a plurality of operations comprising:
writing a first data state to the first memory cell and a second data state into a single other memory cell in the selected column;
then precharging the bit lines of the selected column to a precharge voltage;
then floating the bit lines of the selected column;
selecting a pulse count;
during the floating step, driving a number of pulses of an active level to a word line associated with the first memory cell, the number of pulses corresponding to the pulse count;
after the driving step and during the floating step, driving the word line associated with the other memory cell to an active level;
then precharging the bit lines of the selected column;
then reading the state of the other memory cell;
responsive to the reading step reading the second data state from the other memory cell:
increasing the pulse count; and
then repeating the writing, precharging, floating, driving, precharging, and reading steps;
responsive to the reading step reading the first data state from the other memory cell:
decreasing the pulse count; and
then repeating the writing, precharging, floating, driving, precharging, and reading steps; and
identifying the read margin corresponding to a pulse count value causing the other memory cell to change to the first data state; and
identifying a worst one of the cell stability margin, write margin, and read margin for the first memory cell of the memory.

18. A memory in an integrated circuit, comprising:
a plurality of memory cells, arranged in rows and columns, each memory cell comprised of cross-coupled inverters defining a pair of storage nodes, and a pair of pass transistors, each coupled to one of the storage nodes;
a plurality of pairs of complementary bit lines, each pair of complementary bit lines associated with a column of memory cells;
a plurality of word lines, each word line associated with a row of memory cells, and coupled to the pass transistors in each memory cell in its associated row so that an active level on a word line couples the storage nodes of its associated memory cells in the row to the complementary bit lines of the corresponding columns;
a row decoder, for selectably driving the active level on a selected one of the plurality of word lines in read and write operations;
precharge circuitry, coupled to each of the complementary bit lines, for precharging the bit lines to a precharge voltage in each memory cycle;
write circuitry, for writing a data state to a memory cell in a selected column and a selected row;
sense circuitry, for sensing a data state of a pair of complementary bit lines associated with a selected column; and
test control logic, coupled to the word line driver and to the precharge circuitry, for controlling the precharge circuitry to float the bit lines of a selected column in a test operation, and for controlling the row decoder to drive a selected one of the plurality of word lines to the active level while the precharge circuitry is controlled to float the bit lines of the selected column.

19. The memory of claim 18, wherein the write circuitry comprises:
circuitry for pulling to a logic low level one of a pair of complementary bit lines associated with a selected column;
and wherein the precharge voltage is a voltage higher than a logic high level.

20. The memory of claim 18, wherein the row decoder is for selectably driving the active level on a selected one of the plurality of word lines in read and write operations for a first duration;
and wherein the test control logic controls the row decoder to drive the selected one of the plurality of word lines to the active level while the precharge circuitry is controlled to float the bit lines of the selected column for a second duration, shorter than the first duration.

21. The memory of claim 18, wherein the integrated circuit further comprises:
a processor, coupled to the memory.

22. The memory of claim 18, further comprising:
a plurality of column select circuits, coupled between the plurality of pairs of complementary bit lines and the sense circuitry, each column select circuit associated with a group of pairs of complementary bit lines and receiving a portion of a column address, each column select circuit for coupling one pair of its group of pairs of complementary bit lines to the sense circuitry according to the portion of the column address.

* * * * *